United States Patent
Cheng et al.

(10) Patent No.: US 12,166,486 B2
(45) Date of Patent: Dec. 10, 2024

(54) MANAGING SIGNAL TRANSFERS IN SEMICONDUCTOR DEVICES

(71) Applicant: Macronix International Co., Ltd., Hsinchu (TW)

(72) Inventors: Wei-Yi Cheng, Tainan (TW); Su-Chueh Lo, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 17/983,738

(22) Filed: Nov. 9, 2022

(65) Prior Publication Data

US 2024/0154607 A1  May 9, 2024

(51) Int. Cl.
| | |
|---|---|
| H03K 3/037 | (2006.01) |
| G06F 13/16 | (2006.01) |
| G11C 16/04 | (2006.01) |
| G11C 16/10 | (2006.01) |
| G11C 16/32 | (2006.01) |
| H03K 5/00 | (2006.01) |
| H03K 5/13 | (2014.01) |
| H03K 19/21 | (2006.01) |

(52) U.S. Cl.
CPC ......... *H03K 3/037* (2013.01); *G06F 13/1684* (2013.01); *G11C 16/10* (2013.01); *G11C 16/32* (2013.01); *H03K 5/13* (2013.01); *H03K 19/21* (2013.01); *G11C 16/0483* (2013.01); *H03K 2005/00136* (2013.01)

(58) Field of Classification Search
CPC ....................................................... G06N 7/01
See application file for complete search history.

(56) References Cited

U.S. PATENT DOCUMENTS

| | | | | |
|---|---|---|---|---|
| 6,147,536 | A | * | 11/2000 | Jeong ................... H03K 5/1565 327/263 |
| 9,166,570 | B2 | | 10/2015 | Lewis et al. |
| 10,363,861 | B2 | | 7/2019 | Kamath et al. |
| 10,587,256 | B2 | | 3/2020 | Lee |
| 10,762,950 | B2 | | 9/2020 | Kim et al. |
| 11,469,767 | B1 | | 10/2022 | Zhang |
| 2004/0052152 | A1 | | 3/2004 | Kono |
| 2005/0122148 | A1 | * | 6/2005 | Park ....................... H03K 5/156 327/172 |
| 2010/0231258 | A1 | | 9/2010 | Iwai |

FOREIGN PATENT DOCUMENTS

| | | |
|---|---|---|
| CN | 112100969 A | 12/2020 |
| CN | 114826241 | 7/2022 |
| JP | 2004-110906 | 4/2004 |
| JP | 2009-295263 | 12/2009 |
| KR | 20020077003 A | 10/2002 |

* cited by examiner

*Primary Examiner* — Henry Tsai
*Assistant Examiner* — Juanito C Borromeo
(74) *Attorney, Agent, or Firm* — Fish & Richardson P.C.

(57) ABSTRACT

Systems, methods, circuits, and apparatus for managing signal transfers in semiconductor devices are provided. In one aspect, an integrated circuit includes: one or more target units each configured to receive a signal and a plurality of inverting units arranged on signal paths to the one or more target units. For each of the one or more target units, one or more corresponding inverting units of the plurality of inverting units are configured to invert the signal multiple times along a corresponding signal path to the target unit to cause a signal width of the inverted signal received by the target unit to be substantially identical to a signal width of the signal.

20 Claims, 14 Drawing Sheets

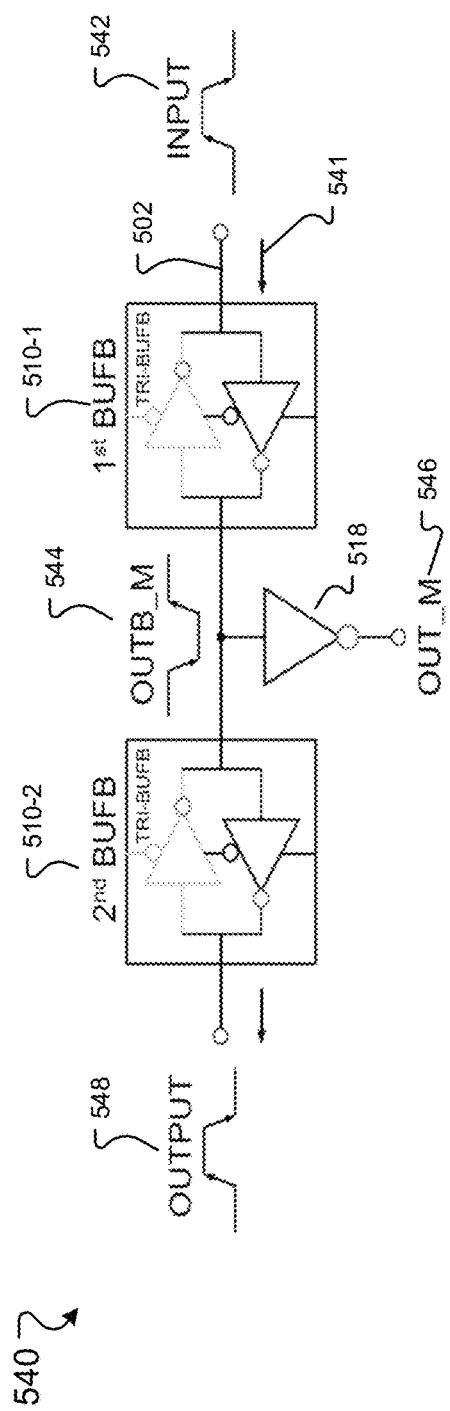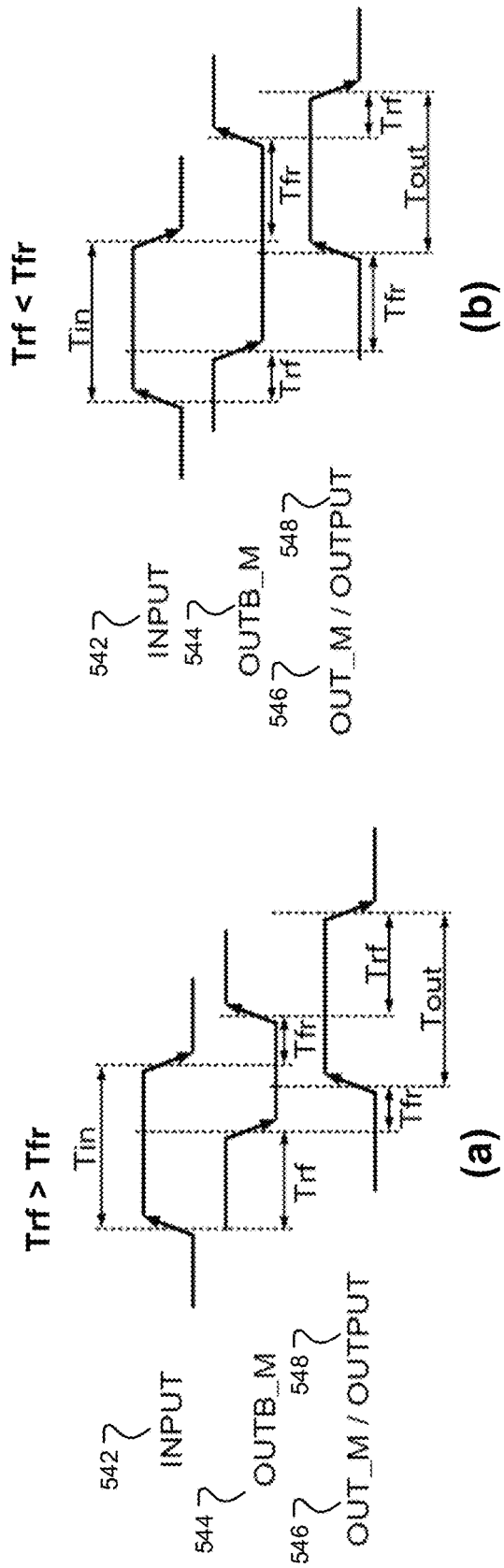
FIG. 5B
FIG. 5C

MANAGING SIGNAL TRANSFERS IN SEMICONDUCTOR DEVICES

BACKGROUND

For high-speed data transfer in semiconductor devices, a quality of signals (e.g., clock signals) along a signal path is crucial. One limitation on the quality of the signals arises from large metal and gate loading on the signal path, which can cause signal distortion to thereby affect the performance of the data transfer.

SUMMARY

The present disclosure describes methods, systems, devices, circuits, and techniques for managing signal transfers in semiconductor devices, for example, by inverting a signal multiple times along signal paths to data units in a semiconductor device to compensate differences between a rising delay time and a falling delay time associated with the signal, which can effectively reduce distortion of the signal on the signal paths and improve the signal transfer and thus data transfer in the semiconductor device.

One aspect of the present disclosure features an integrated circuit, including: one or more target units each configured to receive a signal and a plurality of inverting units arranged on signal paths to the one or more target units. For each of the one or more target units, one or more corresponding inverting units of the plurality of inverting units are configured to invert the signal multiple times along a corresponding signal path to the target unit to cause a signal width of a multi-inverted signal received by the target unit to be substantially identical to a signal width of the signal.

In some embodiments, a number of the multiple times is 2N, where N is an integer. In some embodiments, each of the plurality of inverting units is configured to invert the signal with an odd number of times and a number of the one or more corresponding inverting units is 2M, where M is an integer. In some embodiments, each of the plurality of inverting units is configured to invert the signal with an even number of times, and a number of the one or more corresponding inverting units is O, where O is an integer. In some embodiments, the one or more corresponding inverting units include 2P inverting units that each are configured to invert a signal with an odd number of times and Q inverting units that each are configured to invert a signal with an even number of times, where P is an integer, and Q is an integer.

In some embodiments, the signal is a clock signal that includes periodic pulses each having a rising edge and a falling edge.

In some embodiments, the plurality of inverting units include a first inverting unit and a second inverting unit arranged sequentially on a specific signal path to a specific target unit. The first inverting unit can be configured to invert the signal for a first time to obtain a first inverted signal having a first falling edge and a first rising edge, and the second inverting unit can be configured to invert the first inverted signal for a second time to obtain a second inverted signal having a second rising edge and a second falling edge.

In some embodiments, the signal includes an initial rising edge and an initial falling edge. A first delay time Trf1 is defined by the initial rising edge and the first falling edge, a first delay time Tfr1 is defined by the initial falling edge and the first rising edge, a second delay time Tfr2 is defined by the first falling edge and the second rising edge, and a second delay time Trf2 is defined by the first rising edge and the second falling edge. A sum of Trf1 and Tfr2 is substantially identical to a sum of Tfr1 and Trf2. Trf1 can be different from Tfr1, and Tfr2 can be different from Trf2.

In some embodiments, the integrated circuit further includes a signal bus coupled to each of the one or more target units. Each of the signal paths can include at least a corresponding portion of the signal bus, and the plurality of inverting units can include a plurality of buffering units that are sequentially coupled on the signal bus.

In some embodiments, each of the plurality of buffering units is configured to invert an input signal with an odd number of times. The signal paths can include: a first signal path, along which an even number of buffering units is on the signal bus and 2R additional inverting units is coupled between the signal bus and a first target unit corresponding to the first signal path, where R is an integer identical to or larger than 0, and a second signal path, along which an odd number of buffering units is on the signal bus, and an odd number of additional inverting units is coupled between the signal bus and a second target unit corresponding to the second signal path.

In some embodiments, each of the plurality of buffering units includes a logic inverter, and an additional inverting unit includes one of a logic inverter, an XNOR logic, an XOR logic with an inverting control signal, or a buffering circuit with an odd number of logic inverters.

In some embodiments, the integrated circuit further includes: a logic buffer coupled between the signal bus and the first target unit along the first signal path, and a logic inverter coupled between the signal bus and the second target unit along the second signal path.

In some embodiments, the integrated circuit further includes: an XOR logic coupled between the signal bus and the first target unit along the first signal path, and an XNOR logic coupled between the signal bus and the second target unit along the second signal path.

In some embodiments, the integrated circuit further includes: a first XOR logic coupled between the signal bus and the first target unit along the first signal path and configured to be controlled by a first control signal with a lower voltage level, and a second XOR logic coupled between the signal bus and the second target unit along the second signal path and configured to be controlled by a second control signal with a higher voltage level.

In some embodiments, the integrated circuit further includes: a first buffering circuit coupled between the signal bus and the first target unit along the first signal path, and a second buffering circuit coupled between the signal bus and the second target unit along the second signal path. Each of the first buffering circuit and the second buffering circuit can include: an input, a first output, and a second output, an even number of inverters coupled between the input and the first output, an odd number of inverters coupled between the input and the second output, and the input of the first buffering circuit is coupled to the signal bus, and the first output of the first buffering circuit is coupled to the first target unit, and where the input of the second buffering circuit is coupled to the signal bus, and the second output of the second buffering circuit is coupled to the second target unit.

In some embodiments, each of the first buffering circuit and the second buffering circuit further includes at least one capacitor coupled to a node between adjacent inverters among the even number of inverters.

In some embodiments, the integrated circuit further includes a signal generator configured to generate the signal and transmit the signal along a direction to the one or more target units.

In some embodiments, the integrated circuit further includes at least one of: a first signal generator configured to generate a first signal and transmit the first signal along a first direction to one or more first target units, or a second signal generator configured to generate a second signal and transmit the second signal along a second direction to one or more second target units, where the second direction is opposite to the first direction.

In some embodiments, the plurality of inverting units include a plurality of buffering units that are sequentially coupled on a signal bus. Each of the plurality of buffering unit includes a first logic inverter and a second logic inverter coupled to each other. The first logic inverter can be configured to invert the first signal from the first signal generator and to be turned off when the second signal is transmitted on the signal bus, and the second logic inverter can be configured to invert the second signal from the second signal generator and to be turned off when the first signal is transmitted on the signal bus.

In some embodiments, each of the one or more target units includes a data unit, and the one or more target units are configured to transfer data stored in the one or more target units according to corresponding signals received by the one or more target units.

Another aspect of the present disclosure features a semiconductor device including: a first integrated circuit configured to store data and a second integrated circuit coupled to the first integrated circuit. The first integrated circuit includes: one or more data units each configured to receive a signal and a plurality of inverting units arranged on signal paths to the one or more data units. For each of the one or more data units, one or more corresponding inverting units of the plurality of inverting units are configured to invert the signal multiple times along a corresponding signal path to the data unit to cause a signal width of a multi-inverted signal received by the data unit to be substantially identical to a signal width of the signal. The first integrated circuit is configured to transfer the data from the one or more data units to the second integrated circuit according to corresponding signals received by the one or more data units.

In some embodiments, the first integrated circuit further includes a signal bus coupled to each of the one or more data units, and where each of the signal paths includes at least a corresponding portion of the signal bus. A number of the multiple times is 2N, where N is an integer.

The plurality of inverting units can include a plurality of buffering units that are sequentially coupled on the signal bus, and each of the plurality of inverting units can be configured to invert an input signal for an odd number of times. The signal paths can include: a first signal path, along which an even number of buffering units is on the signal bus and 2R additional inverting units is coupled between the signal bus and a first target unit corresponding to the first signal path, and a second signal path, along which an odd number of buffering units is on the signal bus, and an odd number of additional inverting units is coupled between the signal bus and a second target unit corresponding to the second signal path. R is an integer identical to or larger than 0.

In some embodiments, the semiconductor device further includes a signal generator configured to generate the signal and transmit the signal on the signal bus along a direction to the one or more data units.

In some embodiments, the semiconductor device further includes at least one of: a first signal generator configured to generate a first signal and transmit the first signal on the signal bus along a first direction, or a second signal generator configured to generate a second signal and transmit the second signal on the signal bus along a second direction, where the second direction is opposite to the first direction with respect to the signal bus.

In some embodiments, the plurality of inverting units include a plurality of buffering units that are sequentially coupled on the signal bus. Each of the plurality of buffering units can include a first logic inverter and a second logic inverter. The first logic inverter can be configured to invert the first signal from the first signal generator and to be turned off when the second signal is transmitted on the signal bus, and the second logic inverter can be configured to invert the second signal from the second signal generator and to be turned off when the first signal is transmitted on the signal bus.

In some embodiments, the first integrated circuit includes an input/output (I/O) circuit, and the second integrated circuit includes a cache circuit coupled to the I/O circuit through a first data bus and a second data bus. The semiconductor device can further include a memory cell array having a first memory cell subarray and a second memory cell subarray. The semiconductor device can be configured to: in response to determining to program the data in the first memory cell subarray, transmit the first signal on the signal bus along the first direction to the one or more data units and transfer the data from the one or more data units to the cache circuit through the first data bus and then to the first memory cell subarray, and in response to determining to program the data in the second memory cell subarray, transmit the second signal on the signal bus along the second direction to the one or more data units and transfer the data from the one or more data units to the cache circuit through the second data bus and then to the second memory cell subarray.

In some embodiments, the semiconductor device is configured to: in response to determining to program the data in the memory cell subarray, transmit the first signal on the signal bus along the first direction to one or more first data units and transfer first data from the one or more first data units to the cache circuit through the first data bus, and transmit the second signal on the signal bus along the second direction to one or more second data units and transfer second data from the one or more second data units to the cache circuit through the second data bus.

A further aspect of the present disclosure feature a method including: transmitting a signal to each of one or more data units through a signal bus that is coupled to each of the one or more data units; inverting, for each of the one or more data units, the signal multiple times along a corresponding signal path to the data unit, where a signal width of the inverted signal received by the data unit is substantially identical to a signal width of the signal before the signal is transmitted, where the corresponding signal path includes at least a part of the signal bus; and transferring data stored in the one or more data units according to corresponding signals received by the one or more data units.

In some embodiments, the signal includes an initial rising edge and an initial falling edge. Inverting the signal multiple times can include: inverting the signal for a first time to obtain a first inverted signal having a first falling edge and a first rising edge, and inverting the first inverted signal for a second time to obtain a second inverted signal having a second rising edge and a second falling edge. A first delay time Trf1 is defined by the initial rising edge and the first falling edge, a first delay time Tfr1 is defined by the initial falling edge and the first rising edge, a second delay time Tfr2 is defined by the first falling edge and the second rising edge, a second delay time Trf2 is defined by the first rising edge and the second falling edge, and a sum of Trf1 and Tfr2 is substantially identical to a sum of Tfr1 and Trf2.

In some embodiments, inverting the signal for the first time to obtain the first inverted signal includes: inverting the signal by a first inverting circuit on the signal bus. Inverting the first inverted signal for the second time includes: inverting the first inverted signal by a second inverting circuit that is on the signal bus or on a part of the corresponding signal path between the signal bus and the data unit.

In some embodiments, the first inverting circuit includes a logic inverter, and the second inverting circuit includes one of a logic inverter, an XNOR logic, an XOR logic with an inverting control signal, or a buffering circuit with an odd number of logic inverters.

Implementations of the above techniques include methods, systems, circuits, computer program products and computer-readable media. In one example, a method can be performed in a non-volatile memory and the method can include the above-described actions, e.g., the actions for managing signal transfers. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be applied to any signal (e.g., a clock signal or a pulsed signal such as a pulsed electrical signal, optical signal, or acoustic signal) and/or any signal path with heavy loading (e.g., metal loading and/or gate loading) to reduce signal distortions along the signal path. The techniques can minimize the existence of signal distortion and can be implemented in high-speed applications. The techniques can be implemented with any suitable inverting units, e.g., logic gates, logic inverters, or logic buffers. The techniques can provide signals for any suitable target units, e.g., data units such as data registers, data queues (DQs), data latches, data caches, data modules, or any suitable logic units.

The techniques can be implemented in any circuits or semiconductor devices, including memory devices or logic devices such as microcontrollers. The techniques can be implemented with any types of memory transistors (or memory cells), any types of metal-oxide-silicon (MOS) transistors, e.g., n-type transistors such as NMOS transistors and/or p-type transistors such as PMOS transistors, any types of bipolar junction transistors (BJTs), and any types of operational amplifiers. The techniques can be applied to different types of memory systems, e.g., two-dimensional (2D) memory systems or three-dimensional (3D) memory systems. The techniques can be applied to various memory cell types, such as SLC (single-level cell), or MLC (multi-level cell) like 2-level cell, TLC (triple-level cell), TLC (quad-level cell), or PLC (Penta-level cell). The techniques can be applied to various types of volatile memory devices or non-volatile memory devices, such as Static Random Access Memory (SRAM), Dynamic Random Access Memory (DRAM), flash memory such as NOR flash memory and/or NAND flash memory, resistive random-access memory (RRAM), magnetoresistive random-access memory (MRAM), phase-change random-access memory (PCRAM), among others. Additionally or alternatively, the techniques can be applied to various types of devices and systems, such as secure digital (SD) cards, embedded multimedia cards (eMMC), or solid-state drives (SSDs), embedded systems, among others.

In the present disclosure, "A is substantially identical to B" indicates that: 1) A is exactly identical to B or 2) a difference between A and B is less than a predetermined threshold, e.g., 1% or 0.1% of a value of A or B or any suitable threshold. Similarly, "A is substantially same as B" indicates that: 1) A is the same as B; or 2) a difference between A and B is less than a predetermined threshold, e.g., 1% or 0.1% of a value of A or B or any suitable threshold. As an example, if signal pulse width A is substantially identical to signal pulse width B, it indicates that signal pulse width A is identical to signal pulse width B, or a difference between signal pulse width A and signal pulse width B is less than a threshold, e.g., 0.1% of signal pulse width A or 1 microsecond (µs), 1 nanosecond (ns) or any suitable time. As another example, if time period A is substantially identical to time period B, it indicates that time period A is identical to time period B, or a difference between time period A and time period B is less than a threshold, e.g., 0.1% of time period A or 1 µs, 1 ns or any suitable time.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 5B illustrates an example signal transfer in the integrated circuit of FIG. 5A using the reverse buffers for reducing signal distortions.

FIG. 5C illustrates example transferred signals using the integrated circuit of FIGS. 5A-5B under different relationships between rising to falling delay time Trf and falling to rising delay time Tfr: (a) Trf>Tfr, and (b) Trf<Tfr.

Like reference numbers and designations in the various drawings indicate like elements. It is also to be understood that the various exemplary implementations shown in the figures are merely illustrative representations and are not necessarily drawn to scale.

DETAILED DESCRIPTION

Example Systems and Devices

Figure 1A:
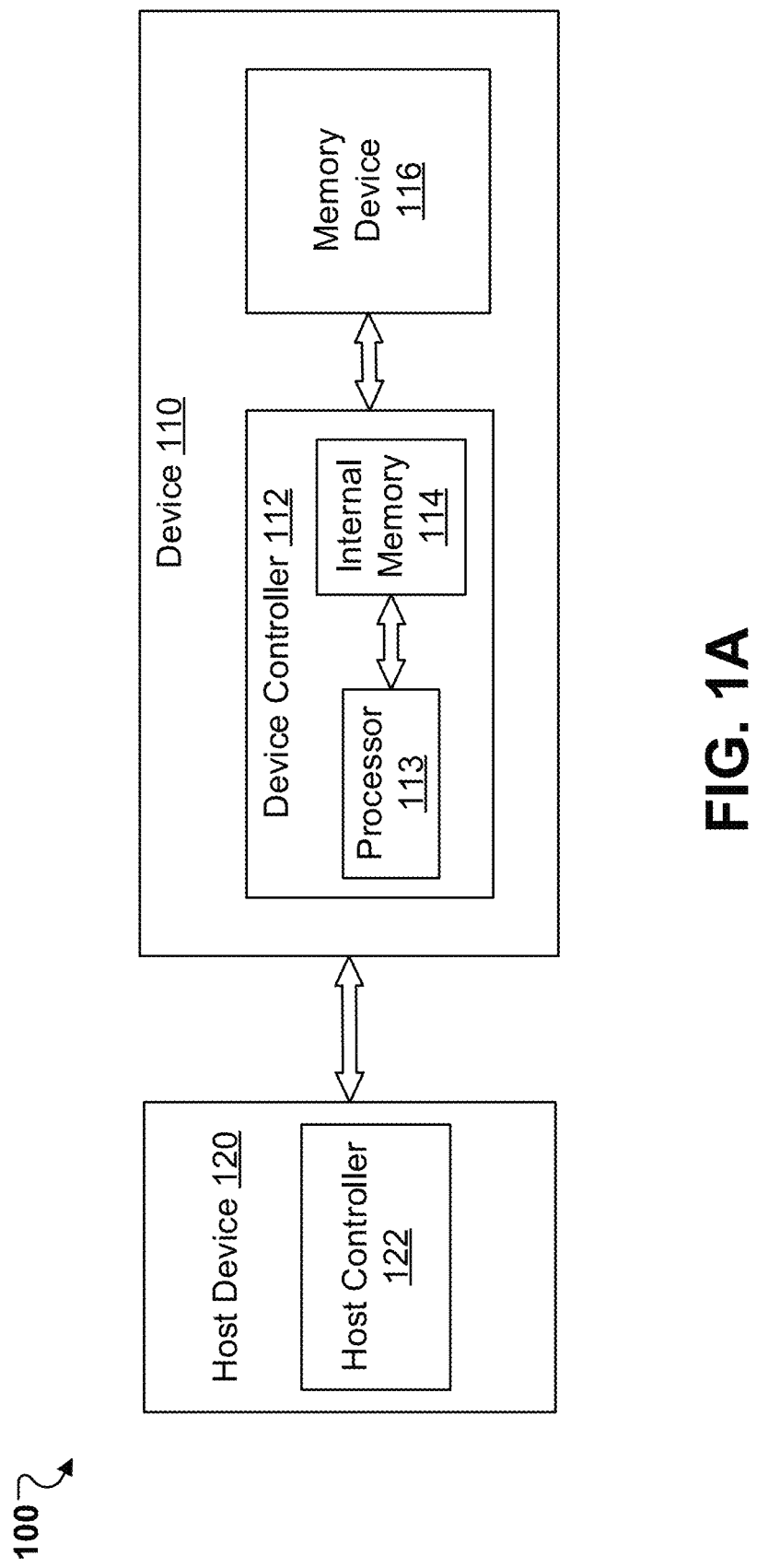
FIG. 1A is a schematic diagram illustrating an example system including a memory device.

FIG. 1A illustrates an example of a system 100. The system 100 includes a device 110 and a host device 120. The device 110 includes a device controller 112 and a memory device 116. The device controller 112 includes a processor 113 and an internal memory 114. In some implementations, the device 110 includes a plurality of memory devices 116 that are coupled to the device controller 112. The host device 120 includes a host controller 122 that can include at least one processor and at least one memory coupled to the at least one processor and storing programming instructions for execution by the at least one processor to perform one or more corresponding operations.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory device 116 to the internal memory 114. The memory device 116 can be a semiconductor device. In some implementations, the memory device 116 is a non-volatile memory that is configured for long-term storage of instructions and/or data, e.g., a NAND flash memory, or some other suitable non-volatile memory. In implementations where the memory device 116 is NAND flash memory, the device 110 is a flash memory, e.g., a flash memory card, and the device controller 112 is a NAND flash controller. For example, in some implementations, when the device 110 is an eMMC or an SD card, the memory device 116 is a NAND flash; in some implementations, when the device 110 is a digital camera, the memory device 116 is an SD card; and in some implementations, when the device 110 is a media player, the memory device 116 is a hard disk.

In some implementations, the device controller 112 is configured to receive data and instructions from and to send data to the host device 120. The device controller 112 is further configured to send data and commands to the memory device 116 and to receive data from the memory device 116. For example, the device controller 112 is configured to send data and a write command to instruct the memory device 116 to store the data to a specified address. As another example, the device controller 112 is configured to receive a read request (or a read command) from the host device 120 and send a corresponding read command to the memory device 116 to read data from a specified address in the memory device 116.

The memory device 116 includes a plurality of blocks. The memory device 116 can be a two-dimensional (2D) memory including 2D memory blocks, e.g., as described with further details in FIG. 1B. The memory device 116 can also be a three-dimensional (3D) memory including 3D memory blocks, e.g., as described with further details in FIG. 1C. Each block can include a same number of pages. Each page has a unique number in the block. Data is stored in the pages of the block according to the order of the unique numbers of the pages in the block. Each page can be read or written separately, and pages in a block can be erased together.

In some implementations, a block can be divided into a number of sub-blocks. Each sub-block can include one or more pages. Each page in a sub-block can be read or written separately. The one or more pages in each sub-block can be erased together. In some implementations, the memory device 116 includes one or more dies. Each die can be a memory chip and include a number of memory arrays and peripheral circuitry thereon. A memory array can include a number of planes, with each plane including a number of physical blocks of memory cells. Each physical block can include a number of pages of memory cells that can store a number of sectors of data. A super block can be specified, e.g., by a memory controller such as the controller 112 of FIG. 1A, to combine at least one physical block from different planes. Each physical block in the super block comes from a different plane, that is, any plane cannot provide more than one block in the super block. The super block includes a number of super pages each combining multiple pages from the corresponding multiple physical blocks in the super block. Each page in a super page can have a same page number in its corresponding physical block. A super page can be programmed with all the pages in the super page being programmed simultaneously.

A memory cell can represent a number of states including an erased state and one or more programmed states. For example, in some cases, the memory cell is a single-level cell (SLC) that can store 1 bit and represent 2 states including an erased state (ER) and a programmed state (A). Memory cells in one word line can form one page. In some cases, the memory cell is a multi-level cell (MLC) such as a 2-level cell that can store 2 bits and represent 4 states including an erased state (ER) and three programmed states (A, B, and C). Memory cells in one word line can form two pages. In some cases, the memory cell is a triple-level cell (TLC) that can store 3 bits and represent 8 states including an erased state (ER) and seven programmed states (A, B, C, D, E, F, and G). Memory cells in one word line can form three pages. The states can have progressively higher voltage ranges, and the erased state has the lowest voltage rage.

Figure 1B:
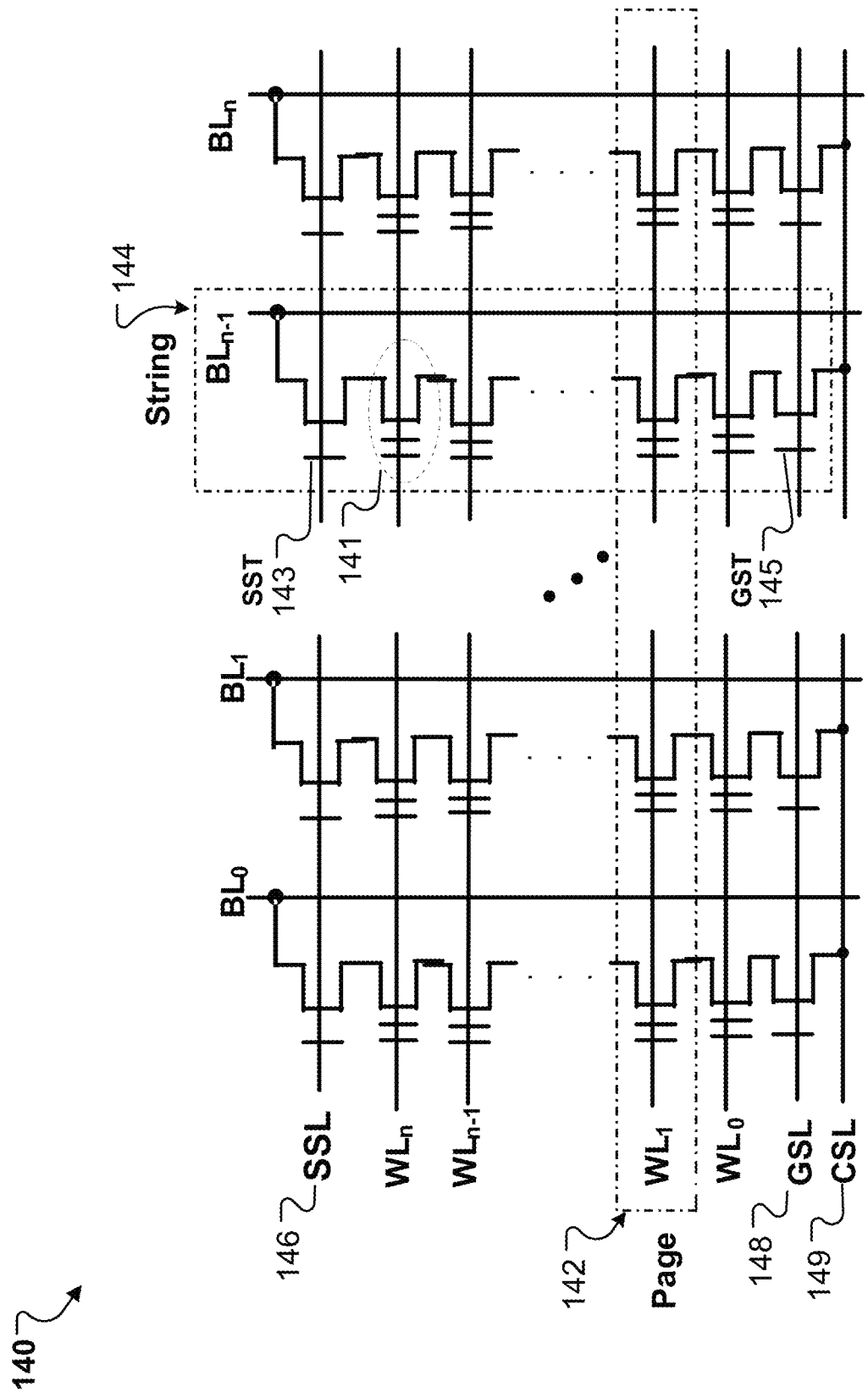
FIG. 1B is a schematic diagram illustrating an example block of a two-dimensional (2D) memory device.

FIG. 1B illustrates an example configuration of a 2D memory block 140 when the memory device 116 is a 2D memory. The block 140 includes memory cells 141 coupled in series to column bit lines $BL_0, BL_1, \ldots, BL_{n-1}$, and $BL_n$ to form a number of cell strings 144, and to row word lines $WL_0, WL_1, \ldots, WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs 143 in different strings are also connected to the same SSL. Gates of the memory cells 141 are respectively connected to word lines $WL_0, WL_1, \ldots, WL_{n-1}, WL_n$. The cell strings 144 or the memory cells 141 are connected to a common source line (CSL) 149 via the GST 145. The CSL 149 can be coupled to a ground or a supply voltage. A gate of the GST 145 is connected to a ground select line (GSL) 148. Gates of the GSTs 145 in different strings 144 are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower read voltage is applied onto a word line corresponding to the particular cell page 142. Meanwhile, a higher read voltage is applied onto the other cell pages in the block 140.

Figure 1C:
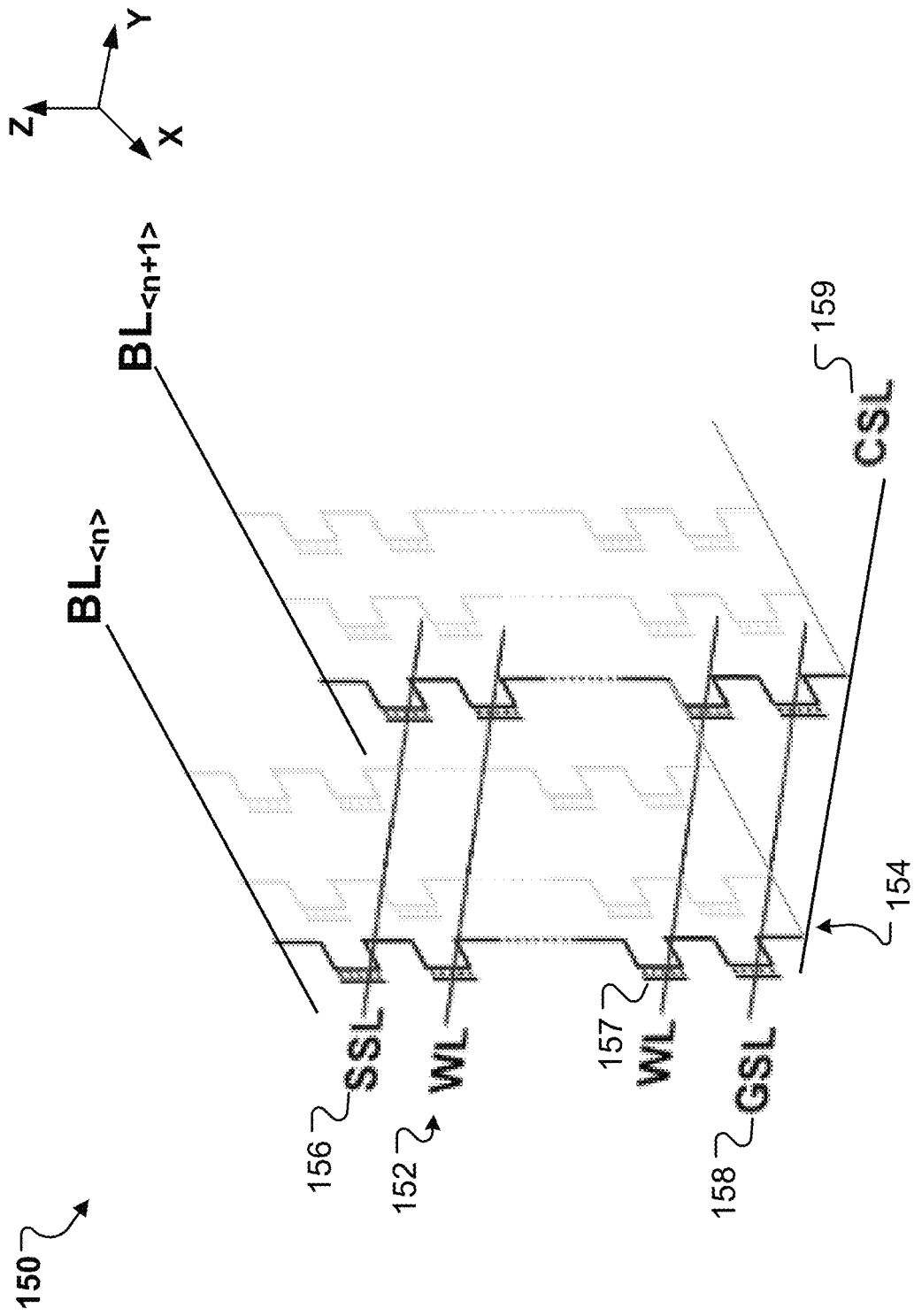
FIG. 1C is a schematic diagram illustrating an example block of a three-dimensional (3D) memory device.

FIG. 1C illustrates an example 3D memory block 150 when the memory device 116 (shown in FIG. 1A) is a 3D memory. The 3D memory block 150 can include a stack of the 2D memory block 140 of FIG. 1B. Memory cells 157 are arranged in three dimensions, e.g., in an XYZ coordinate system, and coupled to a number of word lines to form a number of cell pages (conductive layers or word line layers) 152 and a number of bit lines (e.g., $BL_{<n>}, BL_{<n+1>}$) to form a number of cell strings 154. A cell page 152 can be a layer, e.g., in the XY plane, and memory cells 157 on the same layer can be coupled to one word line and have a same voltage. Each cell page 152 can be connected to a respective contact pad in a driving circuit, e.g., X-decoder (or a scanning driver).

A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 are connected to one or more drivers, e.g., data drivers. The cell strings 154 of the memory cells 157 are connected to a common source line (CSL) 159 via the ground select transistors (GSTs). The CSL 159 can be a conductive layer (or multiple conductive lines) formed on a substrate of the 3D memory. The CSL 159 can be coupled to the ground or a supply voltage.

Figure 2A:
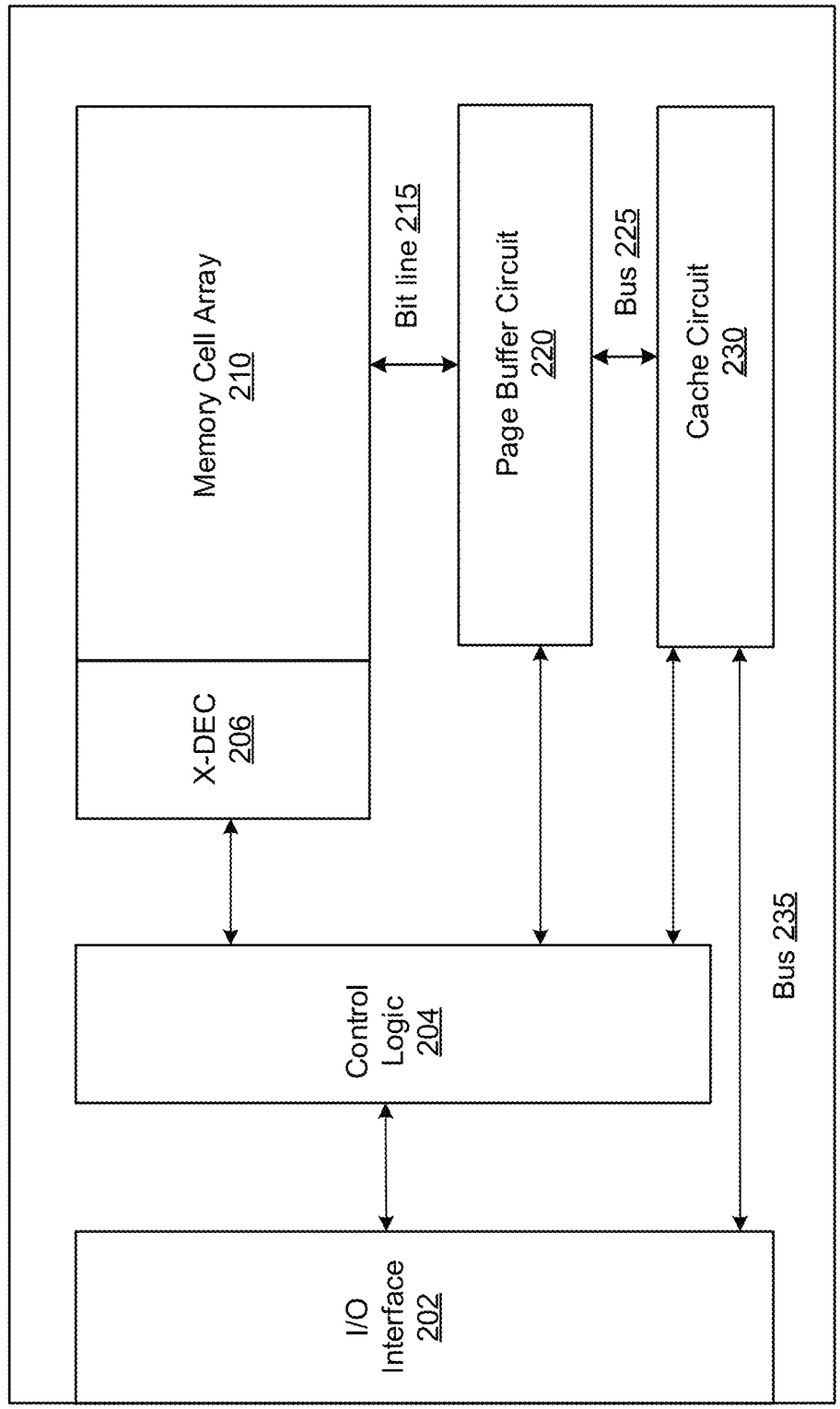
FIG. 2A is a schematic diagram illustrating an example memory device including an I/O interface and a cache circuit.

FIG. 2A is a schematic diagram illustrating an example memory device 200. The memory device 200 can be implemented as the memory device 116 of FIG. 1A. The memory device 200 includes a memory cell array 210. The memory cell array 210 can include a number of memory cells, e.g., the memory cells 141 of FIG. 1B or the memory cells 157 of FIG. 1C, coupled in series to a number of row word lines and a number of column bit lines.

A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory metal-oxide-semiconductor (MOS) device that can store charges.

As shown in FIG. 2A, the memory device 200 can further include an I/O interface 202, a control logic 204, a page buffer circuit 220, and a cache circuit 230. The I/O interface 202 can have multiple input/output (I/O) pins (or ports) for receiving data, e.g., from a controller such as the device controller 112 or the host controller 122 of FIG. 1A, or outputting data from the memory cell array 210. For example, the I/O interface 202 can include 8 data pins [7:0]. The memory device 200 can further include a data buffer configured to buffer data received and outputted through the I/O interface 202. The data buffer can be included in the I/O interface 202, in the cache circuit 230, or between the I/O interface 202 and the cache circuit 230. The data buffer can include a number of data units, e.g., data registers, data queues (DQs), data latches, data caches, data modules, or any suitable logic units.

The memory device 200 can further include an X-decoder (or row decoder) 206 and optionally a Y-decoder. Each memory cell is coupled to the X-decoder 206 via a respective word line and coupled to the Y-decoder via a respective bit line 215. Accordingly, each memory cell can be selected by the X-decoder 206 and the Y-decoder for read or write operations through the respective word line and the respective bit line 215.

The page buffer circuit 220 can be coupled to the memory cell array 210 through the bit lines 215 and coupled to the cache circuit 230 through a data bus 225. The data bus 225 can include one or more conductive lines (e.g., metal lines) that can be coupled through the page buffer circuit 220 and the cache circuit 230. The page buffer circuit 220 can include a number of page buffers. Each page buffer can be coupled to the data bus 225. Each page buffer can include multiple latches. The latches can be conductively connected with one another by inner metal routing lines in the page buffer, e.g., internal data-bus line (IDL). Data can be transferred between the latches in the page buffer through the inner metal routing lines. Data can be also transferred between latches in different page buffers through the data bus 225 and/or inner metal routing lines in the different page buffers.

The cache circuit 230 can be a cache data latch circuit that can include a number of caches for storing data. Each cache can be coupled to the data bus 225. Each cache can include one or more latches that can be conductively connected with one another by inner metal routing lines in the cache. Data can be transferred between the one or more latches in the cache through the inner metal routing lines. Data can be also transferred between latches in different caches in the cache circuit 230 through the data bus 225 and/or inner metal routing lines in the different caches. Data can be also transferred between caches (or latches) in the cache circuit 230 and page buffers (or latches) in the page buffer circuit 220 through the data bus 225. The cache circuit 230 can be coupled to the I/O interface 202 through a data bus 235. The data bus 235 can include one or more conductive lines (e.g., metal lines) that can be coupled through the cache circuit 230 and the I/O interface 202.

In some embodiments, a page buffer is connected to the Y-decoder through a data line associated with a corresponding bit line 215 that connects one or more memory cells in the memory cell array 210. The page buffer can be configured to control a voltage on a corresponding bit line to perform an operation, e.g., read, program, or erase, on a memory cell coupled to the corresponding bit line 215. In some embodiments, during a program or erase operation, the cache circuit 230 is configured to store data from the data buffer in one or more caches of the cache circuit 230 and/or output the data from the one or more caches to one or more page buffers in the page buffer circuit 220. During a read operation, the cache circuit 230 is configured to store data from one or more page buffers of the page buffer circuit 220 in one or more caches of the cache circuit 230 and/or output the data from the one or more caches to the data buffer.

As shown in FIG. 2A, the control logic 204 can be coupled to components in the memory device 200 including the I/O interface 202, the X-decoder 206 (and optionally Y-decoder), the page buffer circuit 220, and the cache circuit 230. The control logic 204 can be configured to receive a command, address information, and/or data, e.g., from a controller such as the device controller 112 or the host controller 122 of FIG. 1A, via the I/O interface 202. The control logic 204 can also process the command, the address information, and/or the data, for example, to generate physical address information, e.g., of blocks/pages, in the memory cell array 210. The control logic 204 can include circuitry, e.g., an integrated circuit integrating multiple logics, circuits, and/or components. In some implementations, the control logic 204 includes at least one of a data register, an SRAM buffer, an address generator, a mode logic, or a state machine. The mode logic can be configured to determine whether there is a read or write operation and provide a result of the determination to the state machine.

During a read operation, the state machine can provide control signals to a voltage generator and the page buffer circuit 220. The voltage generator can provide a read voltage to the X-decoder 206 and the Y-decoder for selecting a memory cell. A page buffer can sense a small power signal (e.g., a current signal) that represents a data bit ("1" or "0") stored in the selected memory cell through a bit line 215 coupled to the page buffer and the selected memory cell. A sense amplifier can amplify the small power signal swing to recognizable logic levels so the data bit can be interpreted properly by logic inside or outside the memory device 200. In some implementations, at least one of the page buffer circuit 220 or the cache circuit 230 is included in the sense amplifier. The data buffer can receive the amplified voltage from the sensor amplifier and output the amplified power signal to the logic outside the memory device 200 through the I/O interface 202.

During a write operation, the data register in the control logic 204 can register input data from the I/O interface 202, and the address generator in the control logic 204 can generate corresponding physical addresses to store the input data in specified memory cells of the memory cell array 210. The address generator can be connected to the X-decoder 206 and the Y-decoder that are controlled to select the specified memory cells through corresponding word lines and bit lines. The SRAM buffer can retain the input data from the data register in its memory as long as power is being supplied. The state machine can process a write signal from the SRAM buffer and provide a control signal to the voltage generator that can provide a write voltage to the X-decoder 206 and/or the Y-decoder. The Y-decoder can be configured to output the write voltage to the bit lines (BLs) for storing the input data in the specified memory cells.

Figure 2B:
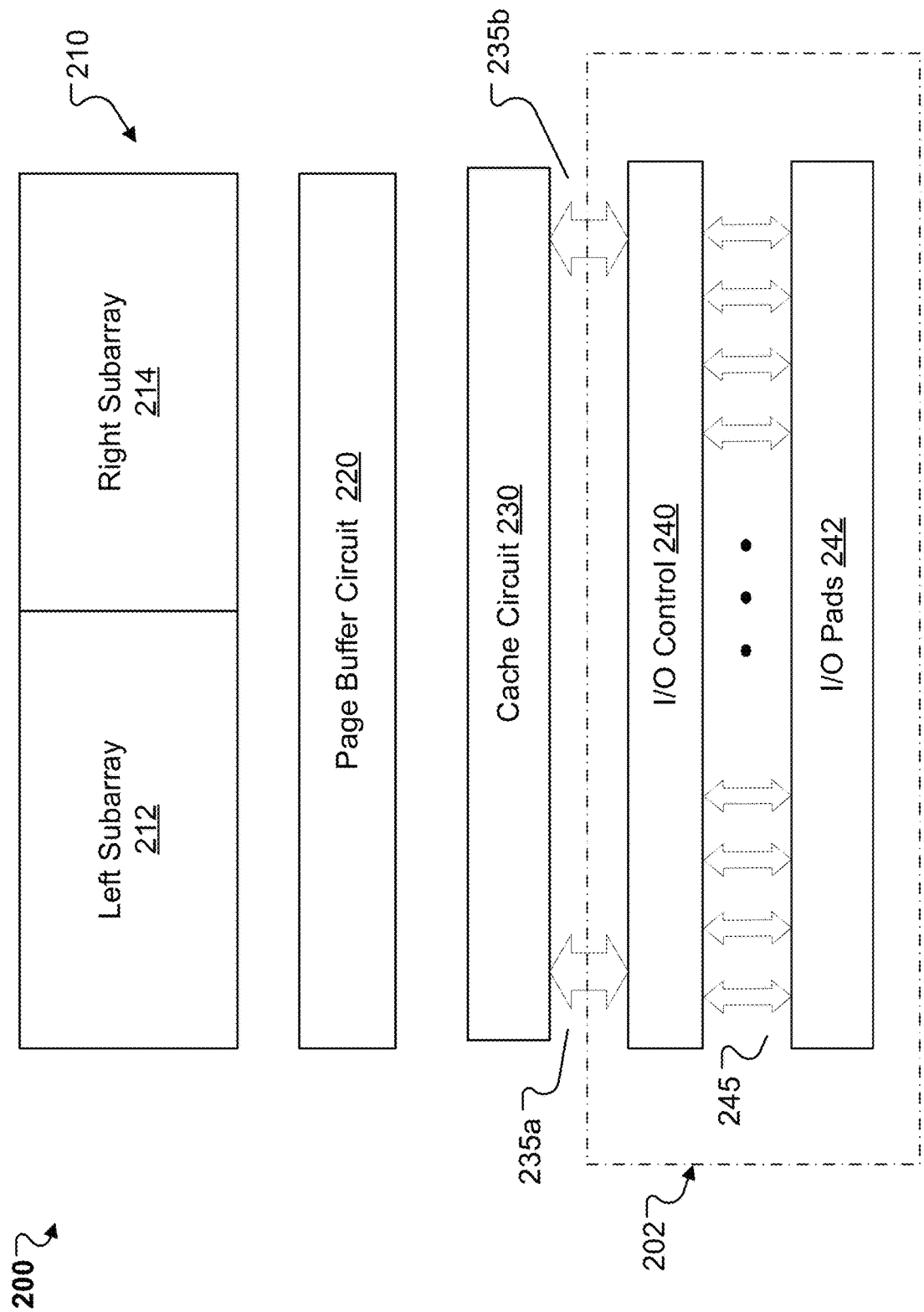
FIG. 2B shows an example data transfer between the I/O interface and the cache circuit in the memory device of FIG. 2A.

FIG. 2B shows an example data transfer between the I/O interface 202 and the cache circuit 230 in the memory device 200 of FIG. 2A. As shown in FIG. 2B, the memory cell array 210 can include multiple memory cell subarrays, e.g., a left subarray 212 and a right subarray 214, arranged adjacent to one another along a direction.

The I/O interface 202 can include I/O pads 242 and an I/O control circuit 240 that are coupled through an internal data bus 245, e.g., multiple conductive lines. The I/O pads 242 can include multiple data pins configured to be conductively coupled to an external controller, e.g., the device controller 112 or the host controller 122 of FIG. 1A, for receiving input data or transmitting output data. The I/O control circuit 240, e.g., as illustrated with further details in FIG. 3A, 5A, 6A, 6B, 7A, or 8A, can be configured to store input data through the I/O pads 242 and transfer the input data to the cache circuit 230 through the data bus 235, e.g., left data bus 235a and right data bus 235b.

In some embodiments, if data is to be written or programmed into the left subarray 212 in the memory cell array 210, the data can be input through the internal data bus 245 into the I/O control circuit 240 that can store the data in a plurality of data units (e.g., DQs). Then, as discussed with further details in FIG. 3A or 5A, a signal, e.g., a clock signal generated by a right signal generator arranged on a right side, can be transferred on a signal bus in the I/O control circuit 240 along a direction from right to left to trigger the data units to transfer the stored data to the cache circuit 230 through the left data bus 235a. Then, the cache circuit 230 can be configured to transfer the stored data to the left subarray 212, which can expedite the data transfer speed.

Similarly, if data is to be written or programmed into the right subarray 214 in the memory cell array 210, the data can be input through the internal data bus 245 into the I/O control circuit 240 that can store the data in the plurality of data units. Then, as discussed with further details in FIG. 3A or 5A, a signal, e.g., a clock signal generated by a left signal generator arranged on a left side, can be transferred on the signal bus in the I/O control circuit 240 along a direction from left to right to trigger the data units to transfer the stored data to the cache circuit 230 through the right data bus 235b. Then, the cache circuit 230 can be configured to transfer the stored data to the right subarray 214, which can expedite the data transfer speed.

Example Integrated Circuits and Signal Transfers

Figure 3A:
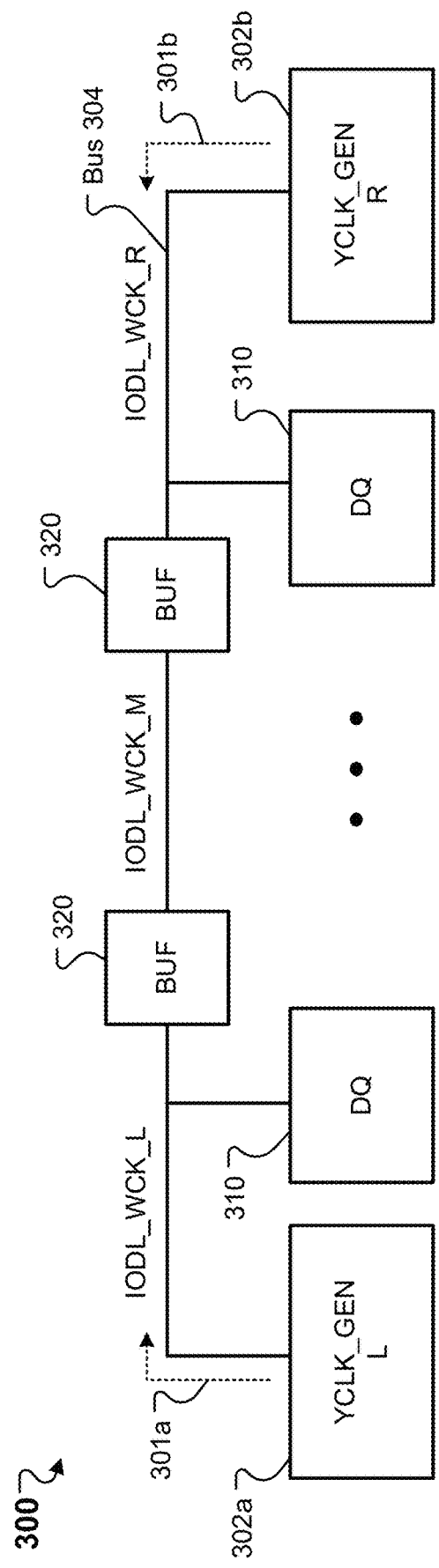
FIG. 3A is a schematic diagram illustrating an example integrated circuit for signal transfer.

FIG. 3A is a schematic diagram illustrating an example integrated circuit 300 for signal transfers. The integrated circuit 300 can be implemented in a semiconductor device, e.g., the memory device 116 of FIG. 1A or the memory device 200 of FIGS. 2A-2B. The semiconductor device can include an I/O interface (e.g., the I/O interface 202 of FIGS. 2A-2B) that can include the integrated circuit 300. The integrated circuit 300 can be an I/O control circuit (e.g., the I/O control circuit 240 of FIG. 2B), or a combination of the I/O control circuit and I/O pads (e.g., the I/O pads 242 of FIG. 2B). The semiconductor device can include a cache circuit (e.g., the cache circuit 230 of FIGS. 2A-2B) that is coupled to the I/O interface for data transfer through a data bus (e.g., the data bus 235 of FIG. 2A or 235a or 235b of FIG. 2B). The semiconductor device can include a memory cell array (e.g., the memory cell array 210 of FIGS. 2A-2B).

As shown in FIG. 3A, the integrated circuit 300 includes a plurality of data queues (DQs) 310 configured to store data, e.g., input data to be programmed or written. The integrated circuit 300 can further include a signal bus 304 coupled to each of the plurality of DQs 310 and configured to transfer a signal (e.g., 301a, 301b) to each DQ 310. The signal can be a clock signal that can include a single pulse or periodic pulses having a rising edge and a falling edge. The signal can be used to trigger the plurality of DQs 310 to transfer data stored in the plurality of DQs 310 out, e.g., to the cache circuit.

The signal (e.g., 301a, 301b) can be generated by a signal generator, e.g., a left signal generator (YCLK_GENL) 302a or a right signal generator (YCLK_GENR) 302b. In some embodiments, the signal generator 302a, 302b can be included in the integrated circuit 300. In some embodiments, the signal generator 302a, 302b can be included in the semiconductor device and can be externally coupled to the integrated circuit 300.

In some cases, the right signal generator 302b can generate the signal 301b and transmit the signal 301b from right to left on the signal bus 304 to the DQs 310, e.g., in response to determining that data is to be stored in a left subarray (e.g., the left subarray 212 of FIG. 2B) of the memory cell array coupled to the cache circuit. The DQs 310 can then transfer data stored in the DQs 310 to the cache circuit according to the received signal 301b, and the cache circuit can further transfer the data to the memory cell array, e.g., to the left subarray.

In some cases, the left signal generator 302a can generate the signal 301a and transmit the signal 301a from left to right on the signal bus 304 to the DQs 310, e.g., in response to determining that data is to be stored in a right subarray (e.g., the right subarray 214 of FIG. 2B) of the memory cell array coupled to the cache circuit. The DQs 310 can then transfer data stored in the DQs 310 to the cache circuit according to the received signals 301a, and the cache circuit can further transfer the data to the memory cell array, e.g., to the right subarray.

In some cases, the plurality of DQs 310 can be divided into left DQs 310 adjacent to the left signal generator 302a and right DQs 310 adjacent to the right signal generator 302b. The left signal generator 302a can transmit the signal 301a to the left DQs 310 that can transfer data stored in the left DQs 310 according to the signal 301a to the cache circuit, and the right signal generator 302b can transmit the signal 301b to the right DQs 310 that can transfer data stored in the right DQs 310 according to the signal 301b to the cache circuit.

Figure 3B:
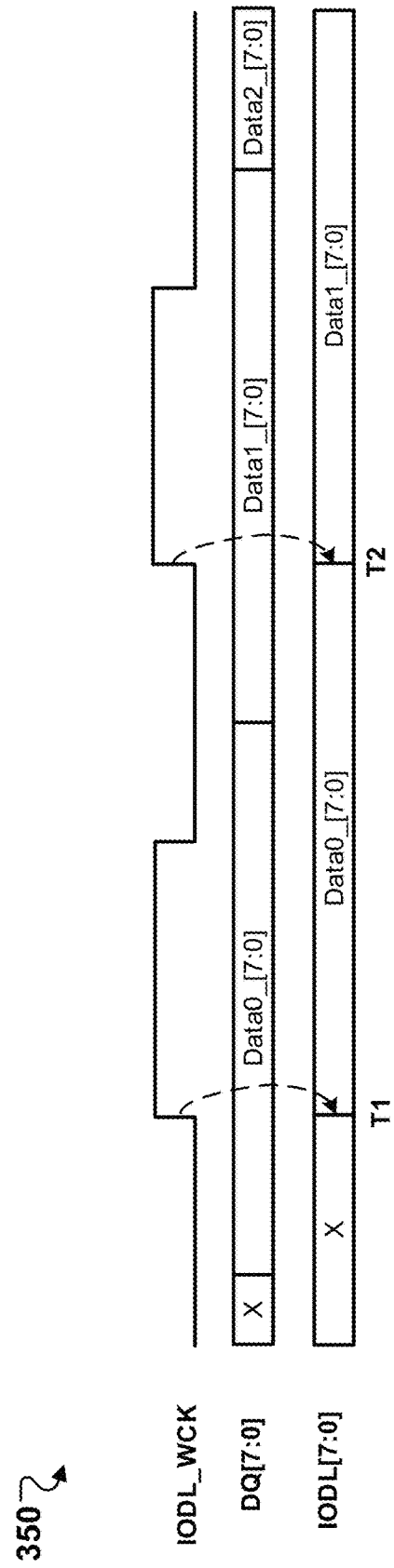
FIG. 3B is a timing diagram illustrating a data transfer using clock signals transferred through a signal bus.

FIG. 3B is a timing diagram 350 illustrating a data transfer using a signal (e.g., the signal 301a or 301b) transferred through the signal bus 304 to the DQs 310. For example, in a write operation, input data is first stored in eight DQs, e.g., DQ[7:0]. The input data can include a number of data sets, e.g., Data0_[7:0], Data1_[7:0], Data2_[7:0] . . . , that are sequentially stored in the eight DQs. Each data set can include 8 bits, and each bit can be stored in a corresponding DQ of the eight DQs. Then, a triggering signal IODL_WCK, e.g., the signal 301a or 301b, is generated and transferred to each DQ through the signal bus 304. Data can then be transferred from the DQs to the cache circuit using a data bus, e.g., IODL[7:0], according to the triggering signal IODL_WCK. For example, at T1, e.g., at a first rising edge of the triggering signal IODL_WCK, a first data set, Data0_[7:0], is transferred from the DQs to the data bus. At time point T2, e.g., at a second rising edge of the triggering signal IODL_WCK, a second data set, Data1_[7:0], is transferred from the DQs to the data bus. The second rising edge is sequential to the first rising edge in the trigger signal IODL_WCK, and the second data set is sequential to the first data in the DQs.

In some cases, in a path of signal transfer, e.g., from DQ0 to DQ7 along the signal bus 304, the signal, e.g., 301a or 301b, may encounter larger metal loading and/or gate loading, which can cause signal distortion to thereby affect data transfer from the DQs.

In some embodiments, as illustrated in FIG. 3A, one or more buffering circuits 320 can be added to the signal bus 304 to increase a driving capability. A buffering circuit 320 can include one or more p-type transistors (e.g., PMOS) and one or more n-type transistors (e.g., NMOS). Under different processes (e.g., different corners) and temperatures, the driving capabilities of the p-type transistors and n-type transistors can be different, which can cause a large difference or variation between a rising delay time Tr and a falling delay time Tf associated with the signal, leading to the distortion of the signal.

Figure 4:
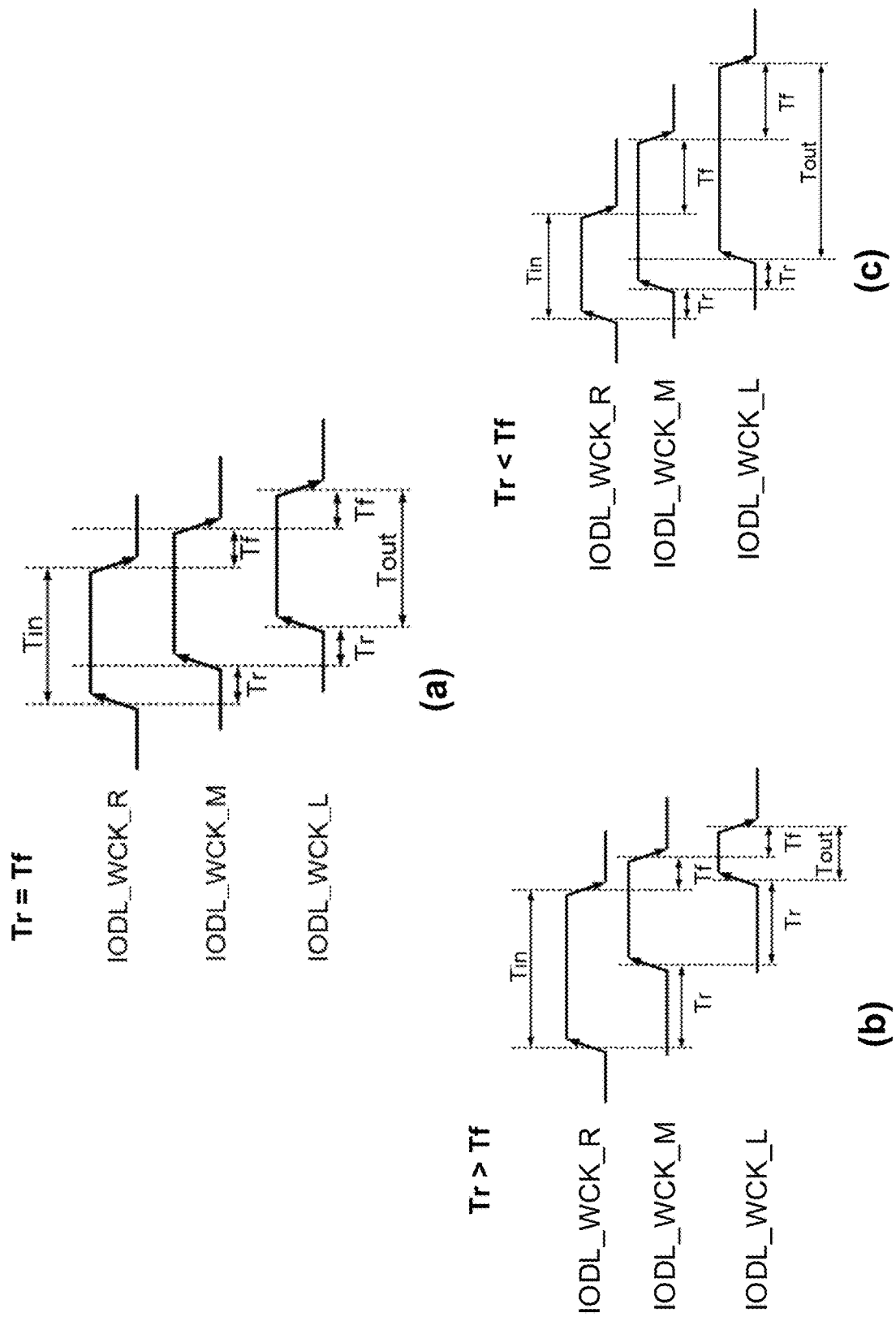
FIG. 4 illustrates example transferred signals under different relationships between rising delay time Tr and falling delay time Tf: (a) Tr=Tf, (b) Tr>Tf, and (c) Tr<Tf.

FIG. 4 illustrates example transferred signals under different relationships between rising delay time Tr and falling delay time Tf: (a) Tr=Tf, (b) Tr>Tf, and (c) Tr<Tf. The rising delay time Tr is a time period defined between rising edges of two adjacent signals (e.g., IODL_WCK_R and IODL_WCK_M or IODL_WCK_M and IODL_WCK_L), and the falling delay time Tf is a time period defined between falling edges of the two adjacent signals. For example, as shown in FIG. 3A, the signal 301b is transferred from the right signal generator 302b to the DQs 310 through the signal bus 304. The transferred signal at different positions along the signal bus 304 can have corresponding profiles, e.g., IODL_WCK_R at a right side of the signal bus 304, IODL_WCK_M at a middle of the signal bus 304, and IODL_WCK_L at a left side of the signal bus 304.

In a case where the signal is undistorted along the signal bus 304, the rising delay time Tr (e.g., between the rising edges of signals IODL_WCK_R and IODL_WCK_M) is substantially identical to the falling delay time Tf (e.g., between the falling edges of signals IODL_WCK_R and IODL_WCK_M), e.g., as shown in diagram (a) of FIG. 4. Thus, the input signal, IODL_WCK_R, can have a signal width Tin, e.g., between a middle of the rising edge and a middle of the falling edge of the signal, which can be substantially identical to a signal width Tout of the output signal, IODL_WCK_L.

If the signal is distorted along the signal bus 304, the rising delay time Tr can be different from the falling delay time Tf, e.g., Tr>Tf or Tr<Tf. In some cases, if the rising delay time Tr is greater than the falling delay time Tf, i.e., Tr>Tf, a signal width of the signal can become smaller and smaller along the signal bus 304. For example, as shown in diagram (b) of FIG. 4, a signal width Tin of the input signal, IODL_WCK_R, can be larger than a signal width of the middle signal, IODL_WCK_M, that can be larger than a signal width Tout of the output signal, IODL_WCK_L. In contrast, in some cases, if the rising delay time Tr is smaller than the falling delay time Tf, i.e., Tr<Tf, a signal width of the signal can become greater and greater along the signal bus 304. For example, as shown in diagram (c) of FIG. 4, a signal width Tin of the input signal, IODL_WCK_R, can be smaller than a signal width of the middle signal, IODL_WCK_M, that can be smaller than a signal width Tout of the output signal, IODL_WCK_L.

Implementations of the present disclosure provide methods, systems, devices, circuits, and techniques for managing signal transfers in semiconductor devices, for example, by inverting a signal multiple times along signal paths to data units in a semiconductor device to compensate differences between a rising delay time and a falling delay time associated with the signal, which can effectively reduce distortion of the signal on the signal paths and improve the signal transfer and thus data transfer in the semiconductor device. As discussed with further details below, the signal can be inverted the multiple times by a number of inverting units, e.g., logic inverters, XNOR, XOR with an inverting control signal, or a buffering circuit with an odd number of logic inverters, arranged on the signal paths to the data units, e.g., on a signal bus and/or between the signal bus and the data units.

Figure 5A:
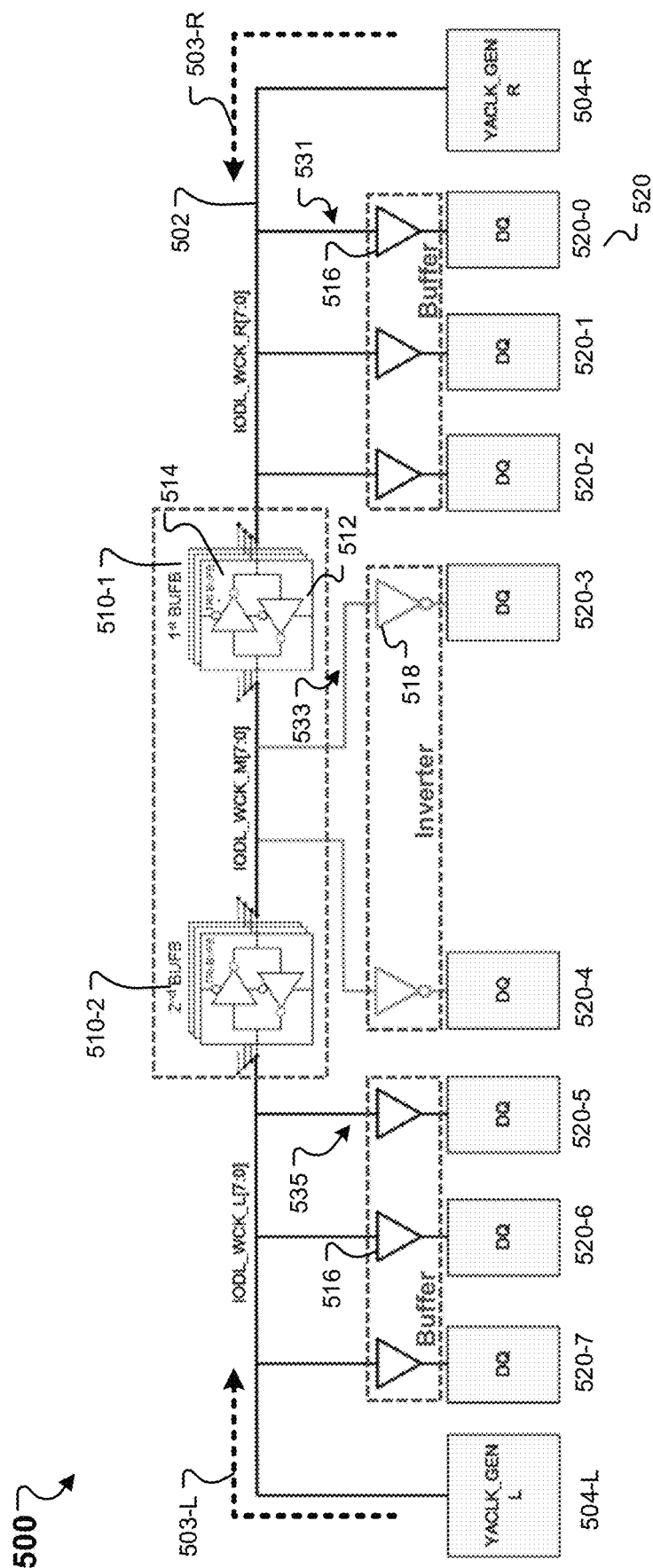
FIG. 5A is a schematic diagram illustrating an example integrated circuit for managing signal transfers using reverse buffers for inverting signals.

FIG. 5A is a schematic diagram illustrating an example integrated circuit 500 for managing signal transfers using reverse buffers for inverting signals. Similar to the integrated circuit 300 of FIG. 3A, the integrated circuit 500 can be implemented in a semiconductor device, e.g., the memory device 116 of FIG. 1A or the memory device 200 of FIGS. 2A-2B. The semiconductor device can include an I/O interface (e.g., the I/O interface 202 of FIGS. 2A-2B) that can include the integrated circuit 500. The integrated circuit 500 can be an I/O control circuit (e.g., the I/O control circuit 240 of FIG. 2B), or a combination of the I/O control circuit and I/O pads (e.g., the I/O pads 242 of FIG. 2B). The semiconductor device can include a cache circuit (e.g., the cache circuit 230 of FIGS. 2A-2B) that is coupled to the I/O interface for data transfer through a data bus (e.g., the data bus 235 of FIG. 2A or 235a or 235b of FIG. 2B). The semiconductor device can include a memory cell array (e.g., the memory cell array 210 of FIGS. 2A-2B).

As shown in FIG. 5A, similar to the integrated circuit 300 of FIG. 3A, the integrated circuit 500 includes a plurality of data queues (DQs), referred to generally as DQs 520 and individually as DQ 520. As an example, eight DQs 520-0, 520-1, . . . , 520-7 are illustrated in FIG. 5A. However, more or less number of DQs can be included in the integrated circuit 500. The DQs 520 are configured to store data, e.g., input data to be programmed or written. The integrated circuit 500 can further include a signal bus 502 (e.g., the signal bus 304 of FIG. 3A) coupled to each of the plurality of DQs 520 and configured to transfer a signal (e.g., 503-L, 503-R) to each DQ 520. The signal can be a clock signal that can include a single pulse signal or a periodic pulses each having a rising edge and a falling edge. The signal can be used to trigger the plurality of DQs 520 to transfer data stored in the plurality of DQs 520 out, e.g., to the cache circuit.

The signal (e.g., 503-L, 503-R) can be generated by a corresponding signal generator, e.g., a left signal generator (YACLK_GENL) 504-L or a right signal generator (YACLK_GENR) 504-R. In some embodiments, as shown in FIG. 5A, the signal generator 504-L, 504-R can be included in the integrated circuit 500. In some embodiments, the signal generator 504-L, 504-R can be included in the semiconductor device and can be externally coupled to the integrated circuit 500. The left signal generator 504-L and the right signal generator 504-R can be similar to, or the same as, the left signal generator 302a, the right signal generator 302b, respectively.

In some cases, the right signal generator 504-R can generate the signal 503-R (e.g., the signal 301b of FIG. 3A) and transmit the signal 503-R from right to left on the signal bus 502 to the DQs 520, e.g., in response to determining that data is to be stored in a left subarray (e.g., the left subarray 212 of FIG. 2B) of the memory cell array coupled to the cache circuit. The DQs 520 can then transfer data stored in the DQs 520 to the cache circuit according to the received signal 503-R, and the cache circuit can further transfer the data to the memory cell array, e.g., to the left subarray. In some cases, the left signal generator 504-L can generate the signal 503-L and transmit the signal 503-L from left to right on the signal bus 502 to the DQs 520, e.g., in response to determining that data is to be stored in a right subarray (e.g., the right subarray 214 of FIG. 2B) of the memory cell array coupled to the cache circuit. The DQs 520 can then transfer data stored in the DQs 520 to the cache circuit according to the received signals 503-L, and the cache circuit can further transfer the data to the memory cell array, e.g., to the right subarray. In some cases, the plurality of DQs 520 can be divided into left DQs 520 (e.g., 520-7, 520-6, 520-5, 520-4) adjacent to the left signal generator 504-L and right DQs 520 (e.g., 520-3, 520-2, 520-1, 520-0) adjacent to the right signal generator 504-R. The left signal generator 504-L can transmit the signal 503-L to the left DQs 520 that transfer data stored in the left DQs 520 according to the signal 503-L to the cache circuit, and the right signal generator 504-R can transmit the signal 503-R to the right DQs 520 that transfer data stored in the right DQs 520 according to the signal 503-R to the cache circuit.

The integrated circuit 500 can be configured to invert a signal (e.g., 503-L or 503-R) multiple times along signal paths to the DQs 520 to compensate a difference between a rising delay time and a falling delay time associated with the signal. In some embodiments, the integrated circuit 500 includes a plurality of inverting units configured to invert the signal multiple times along the signal paths. Each of the inverting units can be configured to invert the signal with an odd number of times (e.g., 1, 3, 5, . . . ). The signal can be inverted 2N times, where N is an integer (e.g., 1, 2, 3, . . . ), to compensate the differences between the rising delay time and the falling delay time of adjacent signals along the signal paths, which can cause a signal width of an output signal received by a DQ 520 to be substantially identical to a signal width of an input signal.

In some embodiments, the plurality of inverting units include a plurality of buffering circuits 510-1, 510-2 (referred to generally as buffering circuits 510 and individually as buffering circuit 510) on the signal bus 502. The buffering circuits 510 can be similar to the buffering circuits 320 of FIG. 3A and be configured to increase a driving capability for a signal to be transferred on the signal bus 502.

Each buffering circuit 510 can be configured to invert an input signal with an odd number of times. The buffering circuit 510 can be a reversed buffer that can be obtained by reversing a tri-state buffer, an inverter-chain buffer, or a logic gate buffer, or any type of buffer. In some embodiments, the buffering circuit 510 includes a first logic inverter 512 configured to invert once an input signal to be transferred from right to left, e.g., the signal 503-R. In some embodiments, the buffering circuit 510 includes a second logic inverter 514 configured to invert once another input signal to be transferred from left to right, e.g., the signal 503-L. A logic inverter can include a pair of PMOS transistor and NMOS transistor. A logic buffer can include two logic inverters coupled in series.

In some examples, as illustrated in FIG. 5A, the buffering circuit 510 includes a reversed tri-state buffer (TRI-BUFB) that can include the first logic inverter 512 and the second logic inverter 514. Each of the first logic inverter 512 and the second logic inverter 514 can be configured to be enabled (or turned on) or disabled (or turned off) by a corresponding control signal. For example, when the signal 503-R is transferred on the signal bus 502, the first logic inverters 512 in the buffering circuits 510-1, 510-2 are enabled (or turned on), and the second logic inverters 514 in the buffering circuits 510-1, 510-2 are disabled (or turned off). Similarly, when the signal 503-L is transferred on the signal bus 502, the second logic inverters 514 in the buffering circuits 510-1, 510-2 are enabled (or turned on), and the first logic inverters 512 in the buffering circuits 510-1, 510-2 are disabled (or turned off).

To compensate a difference between a rising delay time and a falling delay time associated with a signal to thereby reduce signal distortion, the signal can be inverted 2N times by one or more inverting units. For illustration purpose, e.g., as shown in FIGS. 5B-5C, the following description assumes that an input signal 503-R is transferred along a direction 541 from right to left through the signal bus 502 to the DQs 520.

As discussed with further details below, the signal 503-R can be inverted for a first time by the first buffering circuit 510-1 on the signal bus 502, and for a second time by either the second buffering circuit 510-2 on the signal bus 502 or by an additional inverting unit coupled between the signal bus 502 and a corresponding DQ 520. For example, IODL_WCK_M[7:0] can be the inverted signal of IODL_WCK_R[7:0], and IODL_WCK_L[7:0] can be the inverted signal of IODL_WCK_M[7:0], and be the twice-inverted signal of IODL_WCK_R[7:0].

The buffering circuits, e.g., two buffering circuits 510-1, 510-2, can split the signal bus 502 into multiple segments, e.g., 3 segments, and accordingly, separating the DQs 520 into corresponding groups, e.g., 3 groups. The 3 groups can include a right group (e.g., DQs 520-0, 520-1, 520-2) before the buffering circuit 510-1, a middle group (e.g., DQs 520-3, 520-4) between the two buffering circuit 510-1, 510-2, and a left group (e.g., DQs 520-5, 520-6, 520-7) after the buffering circuit 510-2.

For a DQ in the right group, e.g., 520-0, the signal 503-R is transferred from the right signal generator 504-R to the DQ 520-0 along a signal path 531. The signal path 531 can include a portion of the signal bus 502 and a portion of the signal path 531 between the signal bus 502 and the DQ 520-0. As there is no buffering circuit on the signal path 531, the signal 503-R does not need to be inverted or can be inverted with an even number of times along the signal path 531. In some examples, a logic buffer 516 can be coupled between the signal bus 502 and the DQ 520-0. Similarly, a corresponding logic buffer 516 can be coupled between the signal bus 502 and the DQ 520-1 or 520-2.

For a DQ in the middle group, e.g., 520-3, the signal 503-R is transferred from the right signal generator 504-R to the DQ 520-3 along a signal path 533. The signal path 533 can include a portion of the signal bus 502 and a portion of the signal path 533 between the signal bus 502 and the DQ 520-3. As there is the buffering circuit 510-1 on the signal path 533, the signal 503-R is inverted for a first time by the buffering circuit 510-1, e.g., as illustrated in FIGS. 5B-5C. Thus, the signal 503-R can be inverted for as second time between the signal bus 502 and the DQ 520-3. In some examples, a logic inverter 518 can be coupled between the signal bus 502 and the DQ 520-3. Similarly, a corresponding logic inverter 518 can be coupled between the signal bus 502 and the DQ 520-4.

For a DQ in the left group, e.g., 520-5, the signal 503-R is transferred from the right signal generator 504-R to the DQ 520-5 along a signal path 535. The signal path 535 can include a portion of the signal bus 502 and a portion of the signal path 535 between the signal bus 502 and the DQ 520-5. As there are two buffering circuits 510-1, 510-2 on the signal path 535, the signal 503-R is inverted twice sequentially by the first logic inverters 512 in the buffering circuits 510-1, 510-2, e.g., as illustrated in FIGS. 5B-5C. Thus, the signal 503-R does not need to be inverted or can be inverted for an even number of times between the signal bus 502 and the DQ 520-5. In some examples, a logic buffer 516 can be coupled between the signal bus 502 and the DQ 520-5. Similarly, a corresponding logic buffer 516 can be coupled between the signal bus 502 and the DQ 520-6 or 520-7.

FIG. 5B illustrates an example signal transfer 540 in the integrated circuit 500 of FIG. 5A. An input signal INPUT 542 (e.g., the signal 503-R of FIG. 5A) is transferred from right to left along a direction 541 on the signal bus 502. The input signal INPUT 542 is inverted by the first buffering circuit 510-1 to become a first inverted signal OUTB_M 544. The first inverted signal OUTB_M 544 can be further inverted by the second buffering circuit 510-2 on the signal bus 502 (e.g., to a DQ in the left group) to become a second inverted signal OUTPUT 548. The first inverted signal OUTB_M 544 can also be further inverted by the additional logic inverter 518 (e.g., to a DQ in the middle group) to become another second inverted signal OUT_M 546. Signals OUT_M 546 and OUTPUT 548 are obtained by inverting the input signal INPUT 542 twice, that can have a substantially same profile (or waveform), e.g., as illustrated in diagrams (a) and (b) of FIG. 5C.

FIG. 5C illustrates example transferred signals using the integrated circuit 500 of FIGS. 5A-5B under different relationships between rising to falling delay time Trf and falling to rising delay time Tfr: (a) Trf>Tfr, and (b) Trf<Tfr. The rising to falling delay time Trf is defined as a time period between a rising edge of a first signal and a falling edge of a second signal that is an inverted signal of the first signal (e.g., INPUT 542 and OUTB_M 544, or OUTB_M 544 and OUT_M 546 or OUTPUT 548). The falling to rising delay time Tfr is defined as a time period between a falling edge of a first signal and a rising edge of a second signal that is an inverted signal of the first signal (e.g., INPUT 542 and OUTB_M 544, or OUTB_M 544 and OUT_M 546 or OUTPUT 548).

As noted above, in an ideal case, Trf is identical to Tfr. Thus, the twice-inverted signal OUT_M 546 or OUTPUT 548 can have a signal width that is substantially identical to that of the input signal INPUT 542. Due to metal loading and/or gate loading on the signal bus 502 and/or different driving capabilities of PMOS and NMOS transistors under process and temperature variations, the input signal INPUT 542 can be distorted and Trf can be different from Tfr.

In a first case, if the rising to falling delay time Trf is greater than the falling to rising delay time Tfr, i.e., Trf>Tfr, as shown in diagram (a) of FIG. 5C, the inverted signal OUTB_M 544 has a smaller signal width than the input signal INPUT 542, and the twice-inverted signal OUT_M 546 or OUTPUT 548 has a larger signal width than the inverted signal OUTB_M 544. Similarly, in a second case, if the rising to falling delay time Trf is smaller than the falling to rising delay time Tfr, i.e., Trf<Tfr, as shown in diagram (b) of FIG. 5C, the inverted signal OUTB_M 544 has a greater signal width than the input signal INPUT 542, and the twice-inverted signal OUT_M 546 or OUTPUT 548 has a smaller signal width than the inverted signal OUTB_M 544.

As a result, in either case (a) Trf>Tfr or (b) Trf<Tfr, the rising edges between the input signal INPUT 542 and the twice-inverted signal OUT_M 546 or OUTPUT 548 have a delay time that is identical to a sum of Trf and Tfr. Similarly, the falling edges between the input signal INPUT 542 and the twice-inverted signal OUT_M 546 or OUTPUT 548 have a delay time that is identical to a sum of Tfr and Trf. That is, Trf and Tfr can compensate each other. The delay time between the rising edges of the input signal INPUT 542 and the twice-inverted signal OUT_M 546 or OUTPUT 548 is identical to the delay time between the falling edges of the input signal INPUT 542 and the twice-inverted signal OUT_M 546 or OUTPUT 548. Thus, the signal width Tout of the twice-inverted signal OUT_M 546 or OUTPUT 548 can be substantially identical to the signal width Tin of the input signal INPUT 542. The twice-inversion compensates the difference between Trf and Tfr.

To compensate a difference between a rising delay time and a falling delay time associated with a signal, the signal can be inverted 2N times along a signal path, where N is an integer. If the signal is transferred through an odd number of buffering circuits on a signal bus along the signal path, an additional inverting unit, that is configured to invert the signal with an odd number of times, can be added between the signal bus and a corresponding target unit (e.g., DQ 520-3, 520-4). The buffering circuit can include a logic inverter, e.g., the logic inverter 512 of FIG. 5A. The additional inverting circuit can be a logic inverter, e.g., the logic inverter 518 of FIG. 5A, an XNOR logic as illustrated in FIG. 6A, or an XOR logic with an inverting control signal as illustrated in FIG. 6B, or a buffering circuit having an odd number of logic inverters as illustrated in FIGS. 7A-7B.

If the signal is transferred through an even number of buffering circuits on the signal bus along the signal path, no additional inverting unit is needed or an even number of inverting units can be coupled between the signal bus and a corresponding target unit (e.g., DQ 520-5, 520-6, or 520-7). For example, between the signal bus and the corresponding target unit, a logic buffer (e.g., the logic buffer 516 of FIG. 5A), an XOR logic as described in FIG. 6A-6B, or a buffering circuit having an even number of logic inverters as illustrated in FIGS. 7A-7B, can be added.

The signal being transferred along the signal path without through any buffering circuit on the signal bus, e.g., to DQ 520-0, 520-1, or 520-2, can be similar to the case where the signal being transferred through the even number of buffering circuits. Between the signal bus and the corresponding target unit, a logic buffer (e.g., the logic buffer 516 of FIG. 5A), an XOR logic as described in FIG. 6A-6B, or a buffering circuit having an even number of logic inverters as illustrated in FIGS. 7A-7B, can be added.

Figure 6A:
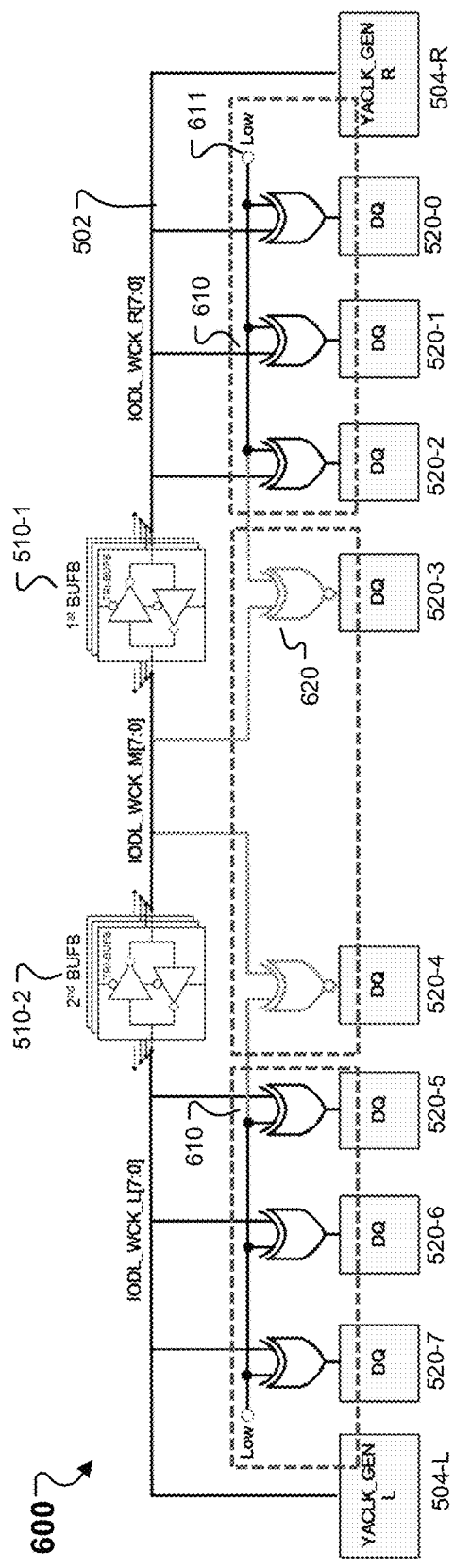
FIG. 6A is a schematic diagram illustrating another example integrated circuit for managing signal transfers using XNOR and XOR logic gates for inverting signals.
Figure 6B:
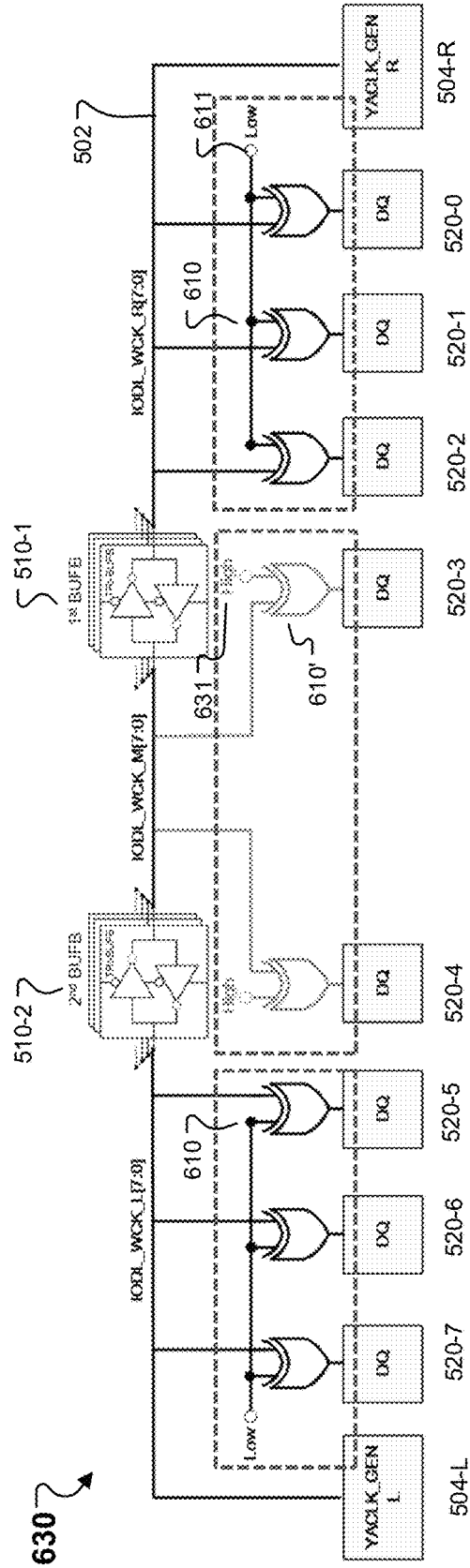
FIG. 6B is a schematic diagram illustrating another example integrated circuit for managing signal transfers using XOR logic gates for inverting signals.
Figure 7A:
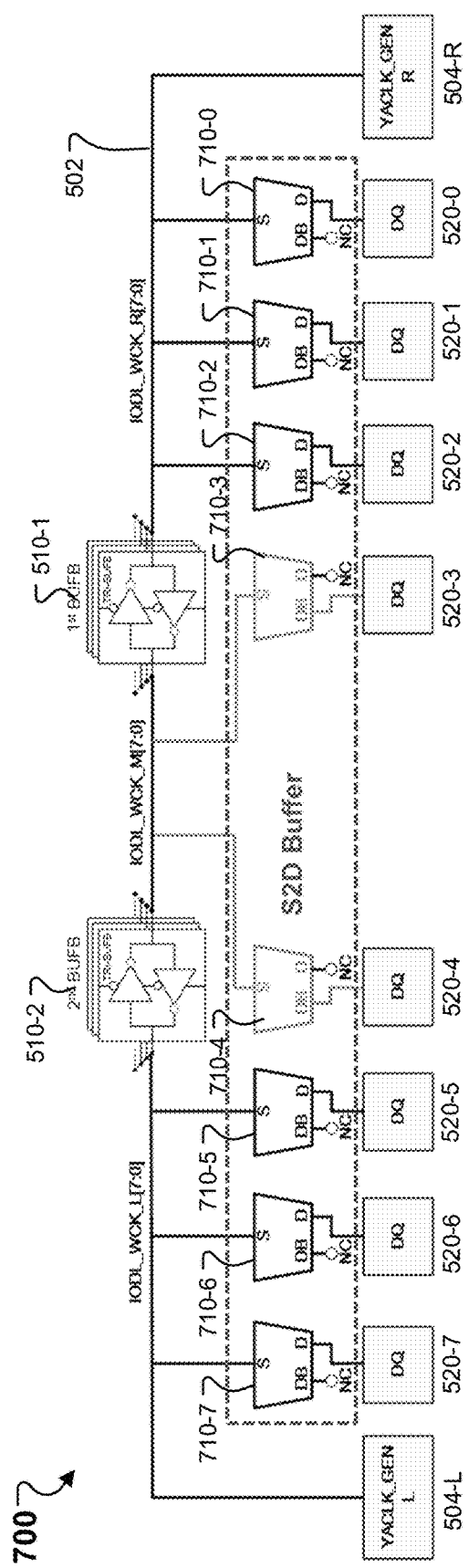
FIG. 7A is a schematic diagram illustrating another example integrated circuit for managing signal transfers using S2D buffers for inverting signals.
Figure 7B:
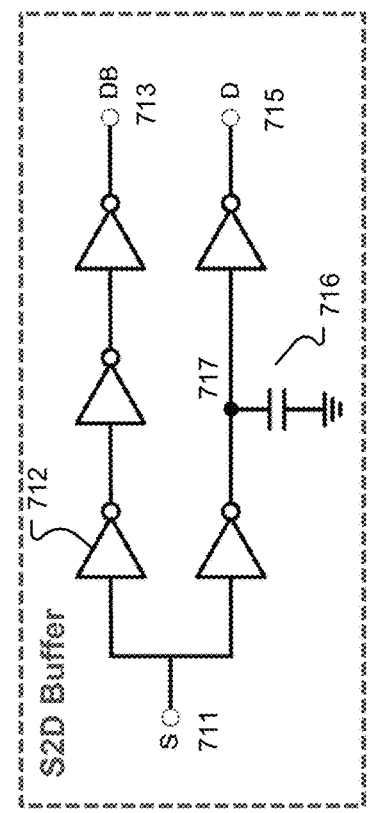
FIG. 7B is a schematic diagram illustrating an example S2D buffer.

FIG. 6A is a schematic diagram illustrating another example integrated circuit 600 for managing signal transfers using XNOR and XOR logics (or logic gates) for inverting signals. As a speed of XNOR logic and XOR logic is close, the integrated circuit 600 can reduce the speed difference between the logic inverter and the logic buffer used in the integrated circuit 500 of FIG. 5A to achieve a better performance for signal transfer.

The integrated circuit 600 can be similar to the integrated circuit 500 of FIG. 5A. However, different from the integrated circuit 500 using the logic buffers 516 and the logic inverters 518 between the signal bus 502 and the DQs 520, as illustrated in FIG. 6A, the integrated circuit 600 uses an XOR logic 610 in replace of the logic buffer 516 (if a signal to a DQ is transferred through no buffering circuit or an even number of buffering circuits 510) and an XNOR 620 in replace of the logic inverter 518 (if a signal to a DQ is transferred through an odd number of buffering circuits 510).

As shown in FIG. 6A, a first input of the XOR logic 610 is coupled to the signal bus 502 and configured to receive the signal transferred through the signal bus 502, and a second input of the XOR logic 610 is coupled to a low voltage level 611 corresponding to bit "0". Similarly, a first input of the XNOR logic 620 is coupled to the signal bus 502 and configured to receive the signal transferred from the signal bus 502, and a second input of the XNOR logic 620 is also coupled to a low voltage level corresponding to bit "0". In such a way, the XOR logic 610 does not invert the signal, while the XNOR logic 620 can invert the signal once.

FIG. 6B is a schematic diagram illustrating another example integrated circuit 630 for managing signal transfers using XOR logics for inverting signals. Instead of using XNOR logic to invert a signal (e.g., for the middle group of DQs 520), the integrated circuit 630 uses an XOR logic 610' having a second input receiving an inverting control signal 631, e.g., a high voltage level corresponding to bit "1". In such a way, the XOR logic 610' with the inverting control signal 631 can invert the signal once, similar to an XNOR logic 620. As the integrated circuit 630 only uses a same type of logic, XOR logic, the integrated circuit 630 can further reduce the speed difference compared to the integrated circuit 600 using two different types of logics XOR and XNOR.

In some embodiments, an integrated circuit can manage signal transfers using only XNOR logics. For example, an XNOR logic 620 can have a second input to receive a high voltage level corresponding to bit "1", and does not invert a signal, which can be used to replace XOR logic 610 (e.g., for the left group or the right group of the DQs 520) that having a second input for receiving a low voltage level corresponding to bit "0" (in FIGS. 6A and 6B).

FIG. 7A is a schematic diagram illustrating another example integrated circuit 700 for managing signal transfers using S2D buffers 710-0, 710-1, 710-2, 710-3, 710-4, 710-5, 710-6, 710-7 (referred to generally as S2D buffers 710 and individually as S2D buffer 710) for inverting signals. The S2D buffers 710 can be used to replace the logic buffers 516 and the logic inverters 518 of FIG. 5A.

FIG. 7B is a schematic diagram illustrating an example S2D buffer 710. As illustrated in FIG. 7B, the S2D buffer 710 has an input S 711 and two outputs DB 713 and D 715. The S2D buffer 710 includes an odd number (e.g., 3) of logic inverters 712 between input S 711 and output DB 713 and an even number (e.g., 2) of logic inverters 712 between input S 711 and output D 715. Thus, an S2D buffer 710 with DB 713 as an output coupled to the DQ 520 can invert an input signal for an odd number of times, which can be used to replace the logic inverter 516 of FIG. 5A. An S2D buffer 710 with D 715 as an output coupled toe the DQ 520 can invert an input signal for an even number of times, which can be used to replace the logic buffer 518 of FIG. 5A.

As shown in FIG. 7B, a path from input S 711 to output DB 713 includes one more logic inverter 712 than a path from input S 711 to output D 715, to compensate a speed difference. In some embodiments, the S2D buffer 710 can include a capacitor 716 coupled to a node 717 between adjacent logic inverters 516 in the path from input S 711 to output D 715. Accordingly, the integrated circuit 700 using the S2D buffers 710 can reduce a speed difference between the logic inverters and logic buffers in the integrated circuit 500 of FIG. 5A to thereby achieve a better performance of signal transfer.

For example, as illustrated in FIG. 7A, the integrated circuit 700 includes a first buffering circuit (e.g., the S2D buffer 710-0) coupled between the signal bus 502 and a first data unit (e.g., the data unit 520-0) along a first signal path, and a second buffering circuit (e.g., the S2D buffer 710-3) coupled between the signal bus and the second data unit (e.g., the data unit 520-3) along the second signal path. Each of the first buffering circuit and the second buffering circuit includes: an input S 711, a first output D 715, and a second output DB 713. An even number of inverters 712 coupled between the input S 711 and the first output D 715, and an odd number of inverters 712 coupled between the input S 711 and the second output DB 713. The input 711 of the first buffering circuit (e.g., the S2D buffer 710-0) can be coupled to the signal bus, and the first output D 715 of the first buffering circuit (e.g., the S2D buffer 710-0) can be coupled to the first data unit (e.g., the data unit 520-0). The input 711 of the second buffering circuit (e.g., the S2D buffer 710-3) is coupled to the signal bus, and the second output DB 713 of the second buffering circuit (e.g., the S2D buffer 710-3) is coupled to the second data unit (e.g., the data unit 520-3). In some embodiments, each of the first buffering circuit and the second buffering circuit further includes at least one capacitor (e.g., the capacitor 716 of FIG. 7B) coupled to a node between adjacent inverters among the even number of inverters.

As described above, n buffering circuits (e.g., 510 of FIG. 5A) on a signal bus (e.g., 502 of FIG. 5A) can split the signal bus into n+1 segments which can correspond to n+1 groups of data units (e.g., DQs 520 of FIG. 5A), where n is an integer. For example, as shown in FIG. 5A, n=2, and the signal bus 502 is split into 3 segments, and the DQs 520 are separated into 3 groups, e.g., a left group, a middle group, and a right group.

Figure 8A:
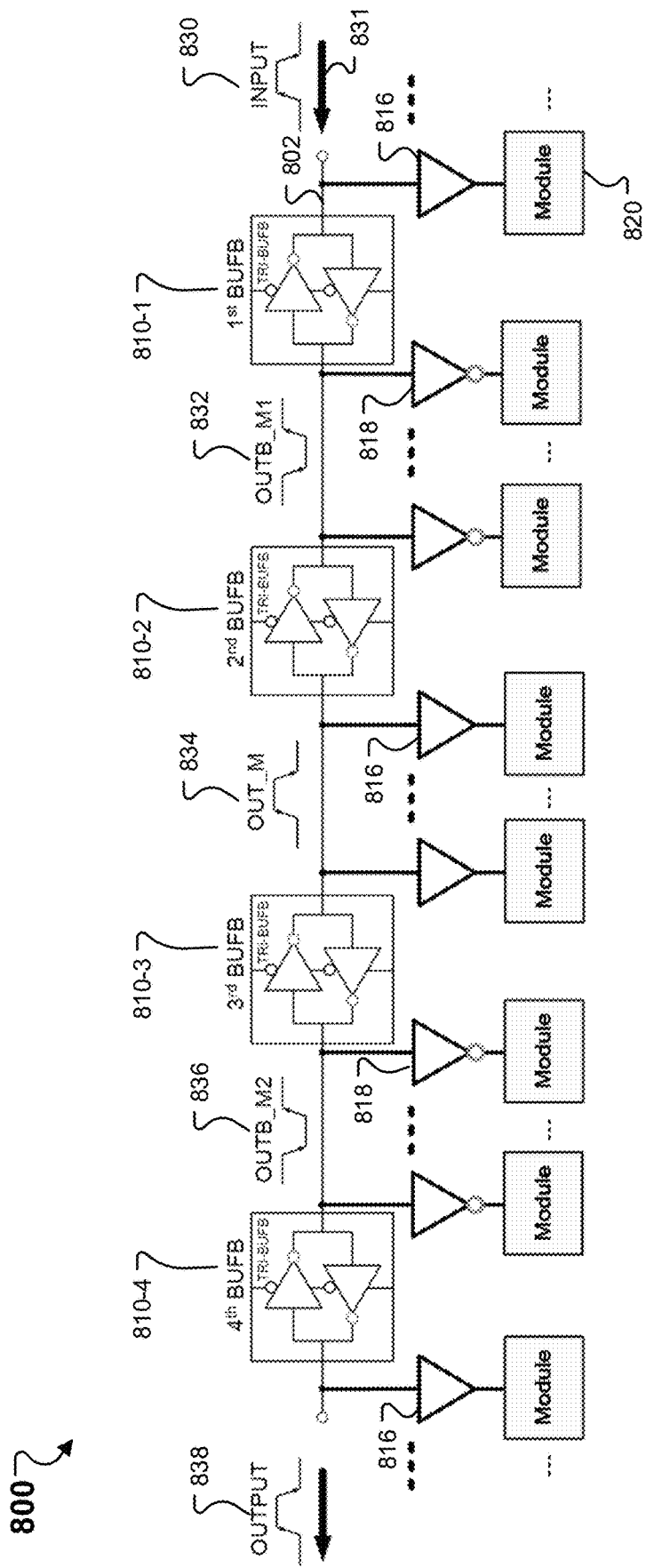
FIG. 8A is a schematic diagram illustrating an example integrated circuit for managing signal transfers using multiple reverse buffers for inverting signals.

FIG. 8A is a schematic diagram illustrating an example integrated circuit 800 for managing signal transfers using buffering circuits for inverting signals. Compared to the integrated circuit 500 including 2 buffering circuits (n=2), the integrated circuit 800 includes 4 buffering circuits (n=4), 810-1, 810-2, 810-3, 810-4 (referred to generally as buffering circuits 810 and individually as buffering circuit 810). Each buffering circuit 810 can be similar to, or the same as, the buffering circuit 510 of FIG. 5A.

An input signal INPUT 830 (e.g., the signal 503-R of FIG. 5A) is transferred along a direction 831 from right to left through a signal bus 802 (e.g., the signal bus 502 of FIG. 5A) to a number of modules 820 (e.g., the DQs 520 of FIG. 5A). The input signal INPUT 830 can be sequentially inverted by the 4 buffering circuits 810 on the signal bus 802. For example, OUTB_M1 832 is the inverted signal of INPUT 830, OUT_M 834 is the inverted signal of OUTB_M1 832 or twice-inverted signal of INPUT 830, OUTB_M2 836 is the inverted signal of OUT_M 834 or triple-inverted signal of INPUT 830, and OUTPUT 838 is the inverted signal of OUTB_M2 836 or quad-inverted signal of INPUT 830.

The 4 buffering circuits 810 can split the signal bus 802 into 5 segments which correspond to 5 groups of modules 820, e.g., a first group, a second group, a third group, a fourth group, and a fifth group along the direction 831. To compensate a difference between a rising delay time and a falling delay time associated with a signal, the signal can be inverted 2N times along a signal path, where N is an integer. If the signal is transferred through an odd number of buffering circuits on the signal bus 802 along the signal path, a logic inverter 818 can be added between the signal bus and a corresponding module, e.g., any module 820 in the second group or the fourth group. If the signal is transferred through no buffering circuit or an even number of buffering circuits 810 on the signal bus 802 along the signal path, between the signal bus and the corresponding module, e.g., any module 820 in the first group, the third group, or the fifth group, a logic buffer 816 can be added.

Figure 8B:
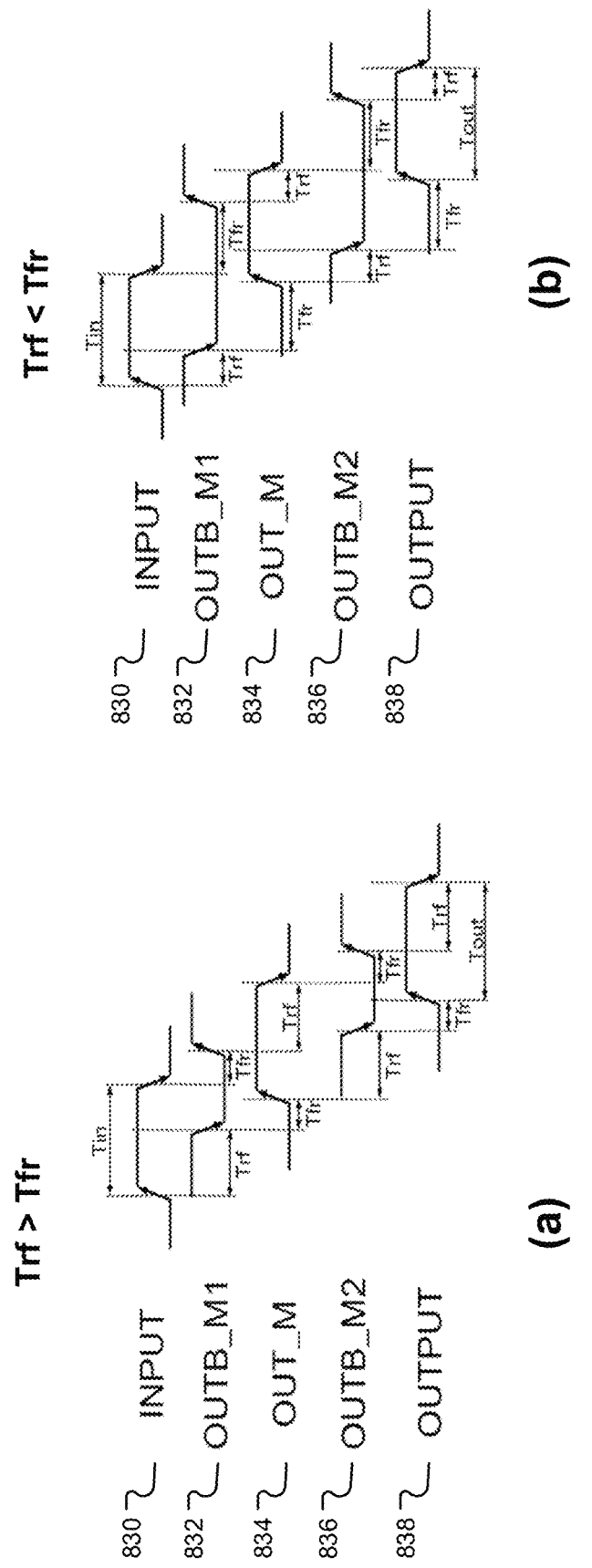
FIG. 8B illustrates example transferred signals using the integrated circuit of FIG. 8A under different relationships between rising to falling delay time Trf and falling to rising delay time Tfr: (a) Trf>Tfr, and (b) Trf<Tfr.

FIG. 8B illustrates example transferred signals, INPUT 830, OUTB_M1 832, OUT_M 834, OUTB_M2 836, and OUTPUT 838, using the integrated circuit 800 of FIG. 8A under different relationships between rising to falling delay time Trf and falling to rising delay time Tfr: (a) Trf>Tfr, and (b) Trf<Tfr.

As shown in FIG. 8B, in either case, Trf and Tfr can compensate each other after the signal is inverted for an even number of times. A delay time between the rising edges of INPUT 830 and OUTPUT 838 (the quad-inverted signal) is a sum of Trf+Tfr+Trf+Tfr, and a delay time between the falling edges of INPUT 830 and OUTPUT 838 (the quad-inverted signal) is a sum of Tfr+Trf+Tfr+Trf. That is, the delay time between the rising edges is identical to the delay time between the falling edges. Thus, a signal width Tout of the signal OUTPUT 838 can be substantially identical to a signal width Tin of the input signal INPUT 830.

Example Process

Figure 9:
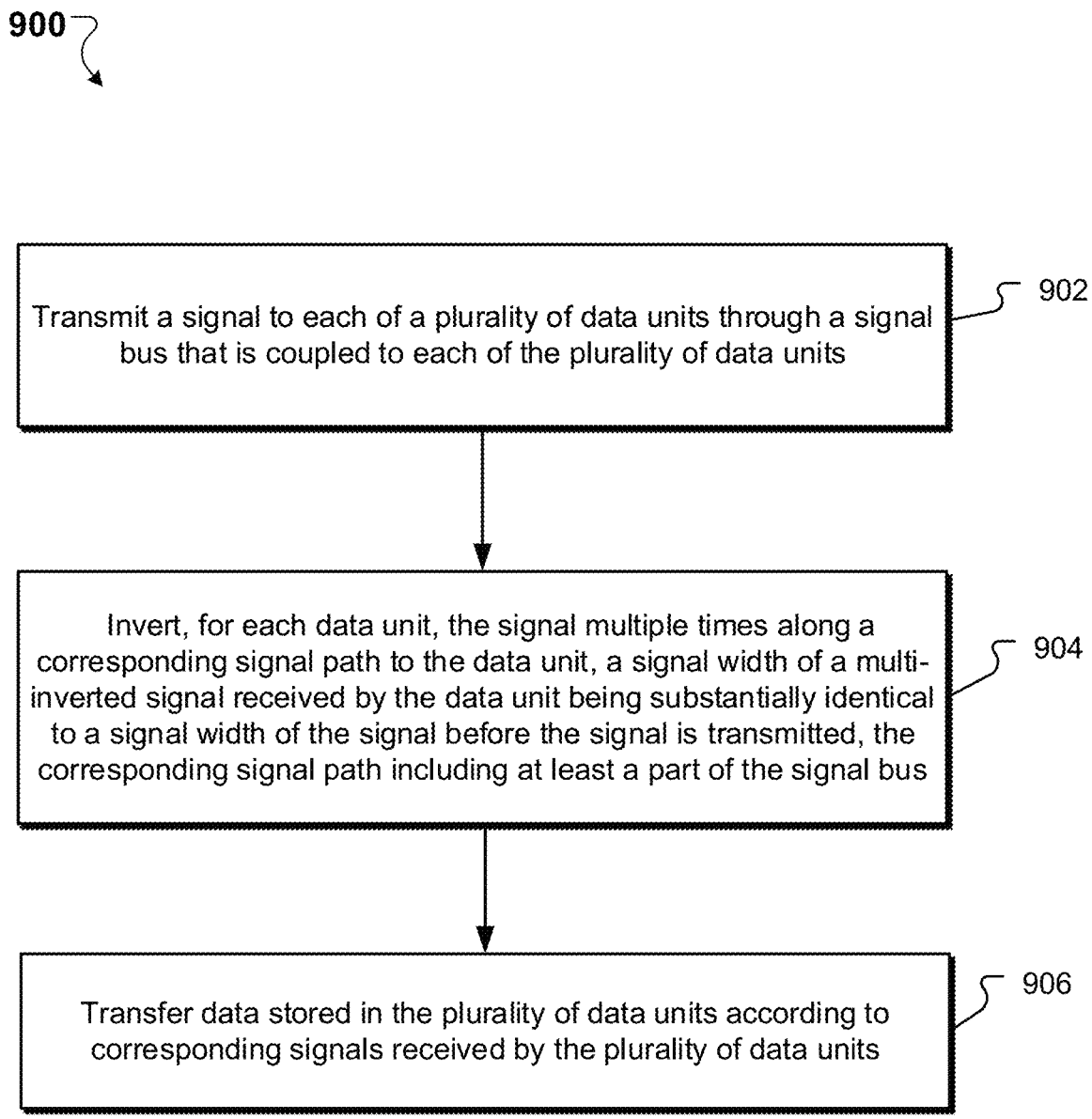
FIG. 9 is a flow chart of an example process for managing a signal transfer in a semiconductor device.

FIG. 9 is a flow chart of an example process 900 for managing signal transfers in an integrated circuit. The integrated circuit can be implemented in a semiconductor device, e.g., the memory device 116 of FIG. 1A or the memory device 200 of FIGS. 2A-2B. The semiconductor device can include an I/O interface (e.g., the I/O interface 202 of FIGS. 2A-2B) that can include the integrated circuit. The integrated circuit can be an I/O control circuit (e.g., the I/O control circuit 240 of FIG. 2B), or a combination of the I/O control circuit and I/O pads (e.g., the I/O pads 242 of FIG. 2B). The semiconductor device can include a cache circuit (e.g., the cache circuit 230 of FIGS. 2A-2B) that is coupled to the I/O interface for data transfer through a data bus (e.g., the data bus 235 of FIG. 2A or 235a or 235b of FIG. 2B). The semiconductor device can include a memory cell array (e.g., the memory cell array 210 of FIGS. 2A-2B).

The integrated circuit can be the integrated circuit 300 of FIG. 3A, 500 of FIG. 5A, 600 of FIG. 6A, 630 of FIG. 6B, 700 of FIGS. 7A-7B, or 800 of FIG. 8A. In some embodiments, the integrated circuit includes a plurality of data units (e.g., the DQs 310 of FIG. 3A, 520 of FIG. 5A, 6A, 6B, or 7A, or the module 820 of FIG. 8A) and a plurality of inverting units arranged on signal paths (e.g., the signal path 531, 533, 535 of FIG. 5A) to the plurality of data units. In some embodiments, an inverting unit can be configured to invert a signal for an odd number of times (e.g., 1, 3, 5, . . . ). For example, the inverting unit can be a logic inverter (e.g., the logic inverter 512, 514 or 518 of FIG. 5A, 6A, 6B or 7A-7B), an XNOR logic (e.g., the XNOR logic 620 of FIG. 6A), an XOR logic with an inverting control signal (e.g., the XOR 610' of FIG. 6B) or a buffering circuit with an odd number of logic inverters (e.g., the S2D buffer 710 with DB as an output of FIG. 7A-7B). In some embodiments, an inverting unit can be configured to invert a signal for an even number of times.

At 902, a signal is transmitted to each of the plurality of data units through a signal bus that is coupled to each of the plurality of data units. The signal bus can be the signal bus 502 of FIG. 5A, 6A, 6B, or 7A-7B, or 802 of FIG. 8A. The signal bus can include one or more conductive lines, e.g., metal lines. The signal can be the signal 503-R or 503-L of FIG. 5A, signal INPUT 542 of FIGS. 5B-5C, or INPUT 830 of FIGS. 8A-8B. In some examples, the signal is a clock signal that can include periodic pulses each having a rising edge and a falling edge. The signal can be also a single pulse signal.

At 904, for each of the plurality of data units, the signal is inverted multiple times along a corresponding signal path to the data unit, causing a signal width of a multi-inverted signal received by the data unit to be substantially identical to a signal width of the signal before the signal is transmitted. The corresponding signal path can include at least a part of the signal bus. A number of the multiple times is 2N, where N is an integer (e.g., 1, 2, . . . ). The multi-inverted signal is a resulted signal after the signal is inverted multiple times.

In some embodiments, the plurality of inverting units include a first inverting unit and a second inverting unit arranged sequentially on a specific signal path (e.g., 535 of FIG. 5A) to a specific data unit (e.g., DQ 520-5 of FIG. 5A). The first inverting unit can be the buffering circuit 510-1 of FIG. 5A, 6A, 6B, or 7A, or 810-1 of FIG. 8A. The second inverting unit can be the buffering circuit 510-2 of FIG. 5A, 6A, 6B, or 7A, or 810-2 of FIG. 8A, or the logic inverter 518 of FIG. 5A, the XNOR logic 620 of FIG. 6A, the XOR logic 610' of FIG. 6B, or the S2D buffer 710 with DB as an output as described in FIG. 7A.

The signal can include an initial rising edge and an initial falling edge. The first inverting unit can be configured to invert the signal for a first time to obtain a first inverted signal (e.g., OUTB_M 544 of FIG. 5B or 5C, or OUTB_M1 832 of FIGS. 8A-8B) having a first falling edge and a first rising edge. The second inverting unit can be configured to invert the first inverted signal for a second time to obtain a second inverted signal (e.g., OUT_M 546 or OUTPUT 548 of FIGS. 5B-5C, or OUT_M 834 of FIG. 8B) having a second rising edge and a second falling edge. A first rising to falling delay time Trf1 is defined by the initial rising edge and the first falling edge, a first falling to rising delay time Tfr1 is defined by the initial falling edge and the first rising edge, a second falling to rising delay time Tfr2 is defined by the first falling edge and the second rising edge, and a second rising to falling delay time Trf2 is defined by the first rising edge and the second falling edge. Trf1 can be different from Tfr1 (e.g., Trf1>Tfr1 or Trf1<Tfr1), and Tfr2 can be different from Trf2 (e.g., Trf2>Tfr2 or Trf2<Tfr2). A sum of Trf1 and Tfr2 is substantially identical to a sum of Tfr1 and Trf2, e.g., as shown in FIG. 5C or 8B.

In some embodiments, each of the plurality of buffering units can be configured to invert an input signal with an odd number of times. The signal paths can include a first signal path (e.g., the path 535 of FIG. 5A). Along the first signal path, an even number of buffering units is on the signal bus and no additional inverting unit or an even number of additional inverting units can be coupled between the signal bus and a first data unit corresponding to the first signal path. For example, a logic buffer (e.g., the logic buffer 516 of FIG. 5A or 816 of FIG. 8A), or an XOR logic (e.g., the XOR logic 610 of FIG. 6A or 6B, the S2D buffer 710 with D as output of FIGS. 7A-7B), can be added between the signal bus and the first data unit.

The signal paths can also include a second signal path (e.g., the path 533 of FIG. 5A). Along the second signal path, an odd number of buffering units can be on the signal bus, and an odd number of additional inverting units can be coupled between the signal bus and a second data unit corresponding to the second signal path. For example, a logic inverter (e.g., the logic inverter 518 of FIG. 5A or 818 of FIG. 8A), or an XNOR logic (e.g., the XNOR logic 620 of FIG. 6A), or an XOR logic 610' with an inverting control signal of FIG. 6B), or a buffering circuit with an odder number of logic inverters (e.g., the S2D buffer with D as an output of FIGS. 7A-7B), can be added between the signal bus and the second data unit.

In some embodiments, the integrated circuit includes a logic buffer (e.g., 516 of FIG. 5A) coupled between the signal bus and the first data unit along the first signal path, and a logic inverter (e.g., 518 of FIG. 5A) coupled between the signal bus and the second data unit along the second signal path.

In some embodiments, the integrated circuit includes an XOR logic (e.g., the XOR logic 610 of FIG. 6A or 6B) coupled between the signal bus and the first data unit along the first signal path, and an XNOR logic (e.g., the XNOR logic 620 of FIG. 6A) coupled between the signal bus and the second data unit along the second signal path.

In some embodiments, the integrated circuit includes a first XOR logic (e.g., the XOR logic 610 of FIG. 6B) coupled between the signal bus and the first data unit along the first signal path and configured to be controlled by a first control signal with a low voltage level corresponding to bit "0", and a second XOR logic (e.g., the XOR logic 610' of IG. 6B) coupled between the signal bus and the second data unit along the second signal path and configured to be controlled by a second control signal with a high voltage level corresponding to bit "1".

In some embodiments, the integrated circuit includes a first buffering circuit (e.g., the S2D buffer 710-0 of FIG. 7A) coupled between the signal bus (e.g., the signal bus 502 of FIG. 7A) and the first data unit (e.g., the data unit 520-0 of FIG. 7A) along the first signal path, and a second buffering circuit (e.g., the S2D buffer 710-3 of FIG. 7A) coupled between the signal bus and the second data unit (e.g., the data unit 520-3 of FIG. 7A) along the second signal path. Each of the first buffering circuit and the second buffering circuit includes: an input (e.g., S 711 of FIGS. 7A-7B), a first output (e.g., D 715 of FIGS. 7A-7B), and a second output (e.g., DB 713 of FIGS. 7A-7B). An even number of inverters (e.g., 712 of FIG. 7B) coupled between the input and the first output, and an odd number of inverters coupled between the input and the second output. The input of the first buffering circuit can be coupled to the signal bus, and the first output of the first buffering circuit can be coupled to the first data unit. The input of the second buffering circuit is coupled to the signal bus, and the second output of the second buffering circuit is coupled to the second data unit. In some embodiments, each of the first buffering circuit and the second buffering circuit further includes at least one capacitor (e.g., the capacitor 716 of FIG. 7B) coupled to a node between adjacent inverters among the even number of inverters.

In some embodiments, the integrated circuit includes a signal generator (e.g., 504-R or 504-L of FIG. 5A, 6A, 6B, or 7A) configured to generate the signal and transmit the signal along a direction to the plurality of data units.

In some embodiments, the integrated circuit includes a first signal generator (e.g., 504-R) configured to generate a first signal (e.g., 503-R) and transmit the first signal along a first direction to a first plurality of data units, a second signal generator (e.g., 504-L) configured to generate a second signal (e.g., 503-L) and transmit the second signal along a second direction to a second plurality of data units. The second direction is opposite to the first direction. The first plurality of data units can be same as or different from the second plurality of data units.

In some cases, the plurality of inverting units include a plurality of buffering units that are sequentially coupled on the signal bus. Each of the plurality of buffering units includes a first logic inverter (e.g. 512 of FIG. 5A) and a second logic inverter (e.g., 514 of FIG. 5A) coupled to each other. The first logic inverter can be configured to invert the first signal from the first signal generator and to be turned off when the second signal is transmitted on the signal bus. The second logic inverter can be configured to invert the second signal from the second signal generator and to be turned off when the first signal is transmitted on the signal bus.

In some embodiments, the semiconductor device is configured to: in response to determining to program the data in the first memory cell subarray, transmit the first signal on the signal bus along the first direction to the plurality of data units and transfer the data from the plurality of data units to the cache circuit through the first data bus and then to the first memory cell subarray, and in response to determining to program the data in the second memory cell subarray, transmit the second signal on the signal bus along the second direction to the plurality of data units and transfer the data from the plurality of data units to the cache circuit through the second data bus and then to the second memory cell subarray.

In some embodiments, the semiconductor device is configured to: in response to determining to program the data in the memory cell subarray, transmit the first signal on the signal bus along the first direction to one or more first data units and transfer first data from the one or more first data units to the cache circuit through the first data bus, and transmit the second signal on the signal bus along the second direction to one or more second data units and transfer second data from the one or more second data units to the cache circuit through the second data bus.

At 906, data stored in the plurality of data units is transferred according to corresponding signals received by the plurality of data units. Data can include a series of data sets that can be sequentially transferred out from the plurality of data units according to the signals, e.g., as illustrated in FIG. 3B.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An integrated circuit, comprising:
   one or more target units each configured to receive a signal comprising an initial rising edge and an initial falling edge; and
   a plurality of inverting units arranged on signal paths to the one or more target units,
   wherein, for each of the one or more target units, one or more corresponding inverting units of the plurality of inverting units are configured to invert the signal multiple times along a corresponding signal path to the target unit to compensate a difference between a rising delay time and a falling delay time associated with the signal along the corresponding signal path to cause a difference between a signal width of a multi-inverted signal received by the target unit and a signal width of the signal to be smaller than a predetermined threshold.

2. The integrated circuit of claim 1, wherein a number of the multiple times is 2N, where N is an integer.

3. The integrated circuit of claim 1, wherein the plurality of inverting units comprise a first inverting unit and a second inverting unit arranged sequentially on a specific signal path to a specific target unit,
   wherein the first inverting unit is configured to invert the signal for a first time to obtain a first inverted signal having a first falling edge and a first rising edge, and
   wherein the second inverting unit is configured to invert the first inverted signal for a second time to obtain a second inverted signal having a second rising edge and a second falling edge.

4. The integrated circuit of claim 3, wherein a first delay time Trf1 is defined by the initial rising edge and the first falling edge, a first delay time Tfr1 is defined by the initial falling edge and the first rising edge, a second delay time Tfr2 is defined by the first falling edge and the second rising edge, and a second delay time Trf2 is defined by the first rising edge and the second falling edge, and
   wherein a sum of Trf1 and Tfr2 is substantially identical to a sum of Tfr1 and Trf2.

5. The integrated circuit of claim 1, further comprising a signal bus coupled to each of the one or more target units, wherein each of the signal paths comprises at least a corresponding portion of the signal bus,
   wherein the plurality of inverting units comprise a plurality of buffering units that are sequentially coupled on the signal bus.

6. The integrated circuit of claim 5, wherein each of the plurality of buffering units is configured to invert an input signal with an odd number of times, and
   wherein the signal paths comprise:
      a first signal path, along which an even number of buffering units is on the signal bus and 2R additional inverting units is coupled between the signal bus and a first target unit corresponding to the first signal path, where R is an integer identical to or larger than 0, and
      a second signal path, along which an odd number of buffering units is on the signal bus and an odd number of additional inverting units is coupled between the signal bus and a second target unit corresponding to the second signal path.

7. The integrated circuit of claim 6, wherein each of the plurality of buffering units comprises a logic inverter, and
   wherein an additional inverting unit comprises one of a logic inverter, an XNOR logic, an XOR logic with an inverting control signal, or a buffering circuit with an odd number of logic inverters.

8. The integrated circuit of claim 6, further comprising:
   a logic buffer coupled between the signal bus and the first target unit along the first signal path, and
   a logic inverter coupled between the signal bus and the second target unit along the second signal path.

9. The integrated circuit of claim 6, further comprising:
   an XOR logic coupled between the signal bus and the first target unit along the first signal path, and
   an XNOR logic coupled between the signal bus and the second target unit along the second signal path.

10. The integrated circuit of claim 6, further comprising:
    a first XOR logic coupled between the signal bus and the first target unit along the first signal path and configured to be controlled by a first control signal with a low voltage level, and
    a second XOR logic coupled between the signal bus and the second target unit along the second signal path and configured to be controlled by a second control signal with a high voltage level.

11. The integrated circuit of claim 6, further comprising:
    a first buffering circuit coupled between the signal bus and the first target unit along the first signal path, and
    a second buffering circuit coupled between the signal bus and the second target unit along the second signal path,
    wherein each of the first buffering circuit and the second buffering circuit comprises:
       an input, a first output, and a second output,
       an even number of inverters coupled between the input and the first output,
       an odd number of inverters coupled between the input and the second output, and
    wherein the input of the first buffering circuit is coupled to the signal bus, and the first output of the first buffering circuit is coupled to the first target unit, and
    wherein the input of the second buffering circuit is coupled to the signal bus, and the second output of the second buffering circuit is coupled to the second target unit.

12. The integrated circuit of claim 1, wherein each of the one or more target units comprises a data unit, and
wherein the one or more target units are configured to transfer data stored in the one or more target units according to corresponding signals received by the one or more target units.

13. A semiconductor device comprising:
a first integrated circuit configured to store data; and
a second integrated circuit coupled to the first integrated circuit,
wherein the first integrated circuit comprises:
one or more data units each configured to receive a signal comprising an initial rising edge and an initial falling edge; and
a plurality of inverting units arranged on signal paths to the one or more data units,
wherein, for each of the one or more data units, one or more corresponding inverting units the plurality of inverting units are configured to invert the signal multiple times along a corresponding signal path to the data unit to compensate a difference between a rising delay time and a falling delay time associated with the signal along the corresponding signal path to cause a difference between a signal width of a multi-inverted signal received by the data unit and a signal width of the signal to be smaller than a predetermined threshold, and
wherein the first integrated circuit is configured to transfer the data from the one or more data units to the second integrated circuit according to corresponding signals received by the one or more data units.

14. The semiconductor device of claim 13, wherein the first integrated circuit further comprises a signal bus coupled to each of the one or more data units, and wherein each of the signal paths comprises at least a corresponding portion of the signal bus,
wherein a number of the multiple times is 2N, where N is an integer,
wherein the plurality of inverting units comprise a plurality of buffering units that are sequentially coupled on the signal bus, and each of the plurality of inverting units is configured to invert an input signal with an odd number of times, and
wherein the signal paths comprise:
a first signal path, along which an even number of buffering units is on the signal bus and 2R additional inverting units is coupled between the signal bus and a first target unit corresponding to the first signal path, where R is an integer identical to or larger than 0, and
a second signal path, along which an odd number of buffering units is on the signal bus and an odd number of additional inverting units is coupled between the signal bus and a second target unit corresponding to the second signal path.

15. The semiconductor device of claim 14, further comprising at least one of:
a first signal generator configured to generate a first signal and transmit the first signal on the signal bus along a first direction, or
a second signal generator configured to generate a second signal and transmit the second signal on the signal bus along a second direction,
wherein the second direction is opposite to the first direction with respect to the signal bus.

16. The semiconductor device of claim 15, wherein each of the plurality of buffering units comprises a first logic inverter and a second logic inverter, and
wherein the first logic inverter is configured to invert the first signal from the first signal generator and to be turned off when the second signal is transmitted on the signal bus, and the second logic inverter is configured to invert the second signal from the second signal generator and to be turned off when the first signal is transmitted on the signal bus.

17. The semiconductor device of claim 16, wherein the first integrated circuit comprises an input/output (I/O) circuit, and the second integrated circuit comprises a cache circuit coupled to the I/O circuit through a first data bus and a second data bus,
wherein the semiconductor device further comprises a memory cell array having a first memory cell subarray and a second memory cell subarray, and
wherein the semiconductor device is configured to:
in response to determining to program the data in the first memory cell subarray, transmit the first signal on the signal bus along the first direction to the one or more data units and transfer the data from the one or more data units to the cache circuit through the first data bus and then to the first memory cell subarray, and
in response to determining to program the data in the second memory cell subarray, transmit the second signal on the signal bus along the second direction to the one or more data units and transfer the data from the one or more data units to the cache circuit through the second data bus and then to the second memory cell subarray.

18. A method comprising:
transmitting a signal to each of one or more data units through a signal bus that is coupled to each of the one or more data units, the signal comprising an initial rising edge and an initial falling edge;
inverting, for each of the one or more data units, the signal multiple times along a corresponding signal path to the data unit to compensate a difference between a rising delay time and a falling delay time associated with the signal along the corresponding signal path to cause a difference between a signal width of a multi-inverted signal received by the data unit and a signal width of the signal before the signal is transmitted to be smaller than a predetermined threshold, wherein the corresponding signal path comprises at least a part of the signal bus; and
transferring data stored in the one or more data units according to corresponding signals received by the one or more data units.

19. The method of claim 18,
wherein inverting the signal multiple times comprises:
inverting the signal for a first time to obtain a first inverted signal having a first falling edge and a first rising edge, and
inverting the first inverted signal for a second time to obtain a second inverted signal having a second rising edge and a second falling edge,
wherein a first delay time Trf1 is defined by the initial rising edge and the first falling edge, a first delay time Tfr1 is defined by the initial falling edge and the first rising edge, a second delay time Tfr2 is defined by the first falling edge and the second rising edge, a second delay time Trf2 is defined by the first rising edge and the second falling edge, and wherein a sum of Trf1 and Tfr2 is substantially identical to a sum of Tfr1 and Trf2.

20. The method of claim 19, wherein inverting the signal for the first time to obtain the first inverted signal comprises:

inverting the signal by a first inverting circuit on the signal bus, and wherein inverting the first inverted signal for the second time comprises:

inverting the first inverted signal by a second inverting circuit that is on the signal bus or on a part of the corresponding signal path between the signal bus and the data unit.

* * * * *